US 8,089,097 B2

(12) United States Patent
D'Evelyn et al.

(10) Patent No.: US 8,089,097 B2
(45) Date of Patent: Jan. 3, 2012

(54) HOMOEPITAXIAL GALLIUM-NITRIDE-BASED ELECTRONIC DEVICES AND METHOD FOR PRODUCING SAME

(75) Inventors: Mark Phillip D'Evelyn, Niskayuna, NY (US); Nicole Andrea Evers, Niskayuna, NY (US); An-Ping Zhang, Niskayuna, NY (US); Jesse Berkley Tucker, Niskayuna, NY (US); Jeffrey Bernard Fedison, Niskayuna, NY (US)

(73) Assignee: Momentive Performance Materials Inc., Albany, NY (US)

( * ) Notice: Subject to any disclaimer, the term of this patent is extended or adjusted under 35 U.S.C. 154(b) by 0 days.

(21) Appl. No.: 10/329,982

(22) Filed: Dec. 27, 2002

(65) Prior Publication Data
US 2004/0124435 A1 Jul. 1, 2004

(51) Int. Cl.
*H01L 29/66* (2006.01)
(52) U.S. Cl. .................................... 257/194; 438/172
(58) Field of Classification Search .................. 438/172; 257/194
See application file for complete search history.

(56) References Cited

U.S. PATENT DOCUMENTS

| 5,637,531 | A | 6/1997 | Porowski et al. |
| 5,962,875 | A | 10/1999 | Motoki et al. |
| 6,273,948 | B1 | 8/2001 | Porowski et al. |
| 6,294,440 | B1 | 9/2001 | Tsuda et al. |
| 6,398,867 | B1 | 6/2002 | D'Evelyn et al. |
| 6,548,333 | B2 * | 4/2003 | Smith .......................... 438/172 |
| 6,690,700 | B2 * | 2/2004 | Takeuchi et al. ........... 372/45.01 |
| 6,787,820 | B2 * | 9/2004 | Inoue et al. .................... 257/192 |
| 2002/0155634 | A1 * | 10/2002 | D'Evelyn et al. ............... 438/48 |
| 2002/0189531 | A1 | 12/2002 | Dwilinski et al. |
| 2004/0137657 | A1 * | 7/2004 | Dmitriev et al. ................ 438/47 |
| 2005/0127394 | A1 * | 6/2005 | Nagahama et al. ........... 257/103 |

FOREIGN PATENT DOCUMENTS

| EP | 0 966 047 A2 | 12/1999 |
| FR | 2 796 657 A1 | 1/2001 |
| JP | P2000-22212 A | 1/2000 |
| WO | WO 01/24921 A1 | 4/2001 |

OTHER PUBLICATIONS

H. Jacobs and D. Schmidt, "High Pressure Ammonolysis in Solid-State Chemistry", *Current Topics in Materials Science*, vol. 8, edited by E Kaldis (North-Holland, 1982), Chapter 5, pp. 383-427.
Dwilinski et al., "GaN Synthesis by Ammonothermal Method" Acta Physica Polonica A, vol. 88, No. 5, pp. 833-836 (1995).
Dwilinski et al., "On GaN Crystallization by Ammonothermal Method" Acta Physica Polonica A, vol. 90, No. 4, pp. 763-766 (1996).
Kolis et al. ,"Materials Chemistry and Bulk Crystal Growth of Group III Nitrides in Supercritical Ammonia", Mater. Res. Soc. Symp. Proc., vol. 495, pp. 367-372 (1998).

(Continued)

*Primary Examiner* — Richard A. Booth
(74) *Attorney, Agent, or Firm* — Joseph E. Waters

(57) ABSTRACT

There is provided an electronic device. The electronic device includes at least one epitaxial semiconductor layer disposed on a single crystal substrate comprised of gallium nitride having a dislocation density less than about $10^5$ per $cm^2$. A method of forming an electronic device is also provided. The method includes providing a single crystal substrate comprised of gallium nitride having a dislocation density less than about $10^5$ per $cm^2$, and homoepitaxially forming at least one semiconductor layer on the substrate.

18 Claims, 17 Drawing Sheets

OTHER PUBLICATIONS

Dwilinski et al., "AMMONO Method of BN, AlN, and GaN Synthesis and Crystal Growth", MRS Internet Journal Nitride Semiconductor Research 3, article 25 (1997).

Dwilinski et al., "AMMONO Method of GaN and AlN Production", Diamond and Related Materials 7, pp. 1348-1350 (1998).

Pankove et al., "Molecular Doping of Gallium Nitride" Applied Physics Letters, vol. 74, No. 416 pp. 416-418 (1999).

Porowski, "Near Defect-Free GaN Substrates" MRS Internet Journal Nitride Semiconductor Research 4S1, Article GI.3 (1999).

T. Hino et al., "Characterization of threading dislocations in GaN Epitaxial Layers" Applied Physics Letters vol. 76, No. 23, pp. 3421-3423 (2000).

Ketchum et al., "Crystal Growth of Gallium Nitride in Supercritical Ammonia", Journal of Crystal Growth 222, pp. 431-434(2001).

Raghothamachar et al., "Synchrotron White Beam Topography Characterization of Physical Vapor Transport Grown AlN and Ammonothermal GaN", Journal of Crystal Growth 246, pp. 271-280 (2002).

* cited by examiner

HOMOEPITAXIAL GALLIUM-NITRIDE-BASED ELECTRONIC DEVICES AND METHOD FOR PRODUCING SAME

CROSS-REFERENCE TO RELATED PATENT APPLICATIONS

This application is related to U.S. patent application entitled "IMPROVED GALLIUM NITRIDE CRYSTAL AND METHOD FOR MAKING", application Ser. No. 10/329,981, now U.S. Pat. 7,098,487, filed concurrently herewith.

BACKGROUND OF THE INVENTION

This invention is related generally to homoepitaxial gallium nitride (GaN) based electronic devices and specifically to homoepitaxial GaN based transistors, rectifiers, thyristors, and cascode switches.

Gallium nitride (GaN) based electronic devices offer superior high voltage, high power, high temperature, and high frequency operation, as compared to analogous devices fabricated on silicon, gallium arsenide (GaAs) or indium phosphide (InP) substrates due to GaN's wide bandgap, high breakdown field, and high saturation velocity. A variety of types of GaN-based devices are of interest for microwave power amplifier and low-noise amplifier applications, including metal semiconductor field effect transistors (MESFETs), metal oxide field effect transistors (MOSFETs), metal insulator field effect transistors (MISFETs), bipolar junction transistors (BJTs). Heterojunction bipolar transistors (HBTs) and high electron mobility transistors (HEMTs), also known as heterojunction field-effect transistors (HFETs), modulation-doped field effect transistors (MODFETs), two-dimensional electron gas field effect transistors (TEGFETs), or selectively-doped heterostructure transistors (SDHTs), which take advantage of the bandgap engineering possible with III-V heterojunctions to provide considerably higher electron mobilities than analogous MESFETs. Additional GaN-based devices are of interest for power electronic applications, including thyristors, Schottky rectifiers, p-i-n diodes, power vertical MOSFETs, power vertical junction field effect transistors (JFETs), and cascode switches, which take advantage of GaN's wide bandgap, high breakdown field, high thermal conductivity, and high electron mobility.

Typically, GaN-based electronic devices have employed heteroepitaxial growth of GaN and AlGaN on sapphire or SiC substrates. A thin low-temperature nucleation layer, AlN or GaN, also referred to as a buffer layer, is typically used in order to accommodate the lattice mismatch between GaN and the substrate and maintain an epitaxial relationship to the substrate. This approach suffers from a number of drawbacks, including: (i) generation of about $10^{10}$ threading dislocations per cm$^2$ due to lattice mismatch, degrading device performance; (ii) excess strain in the device structure, due to thermal expansion mismatch, resulting in degraded performance, device yield, and reliability; and (iii) in the case of sapphire substrates, poor heat dissipation. Heteroepitaxial GaN-based electronic devices have been able to demonstrate performance levels that are satisfactory for some applications, but do not have the requisite level of reliability.

At least one homoepitaxial GaN-based electronic device design, a HEMT, has been reported to date. Khan et al. [Appl. Phys. Lett. 76, 3807 (2000)] disclose the fabrication of an AlGaN/GaN HEMT on a bulk GaN substrate that was grown in a liquid Mg/Ga alloy at temperatures of 1300-1500° C. and $N_2$ pressures of 15-20 kbar. These substrates, however, have several disadvantages including: (i) a high concentration of Mg and O atoms, approximately $10^{19}$ cm$^{-3}$ each [J. I. Pankove et al., Appl. Phys. Lett. 74, 416 (1999)], which could potentially diffuse into device structures during high temperature processing; and (ii) relatively poor thermal conductivity. Dopants may diffuse into the undoped GaN buffer layer, in which transport by the two-dimensional electron gas is designed to occur, degrading carrier mobility. In addition, the presence of the point defects scatters phonons in the bulk GaN substrate and degrades thermal conductivity, which is detrimental to achieving theoretical performance levels in GaN-based HEMTs. In fact, the homoepitaxial HEMT reported by Khan et al. actually had a slightly inferior performance to a similar device fabricated on a SiC substrate.

SUMMARY OF THE INVENTION

In accordance with one aspect of the present invention, there is provided a homoepitaxial gallium nitride based electronic device. The device comprises at least one epitaxial semiconductor layer disposed on a single crystal substrate comprised of gallium nitride, the substrate having a dislocation density less than about $10^5$ per cm$^2$, wherein the at least one epitaxial semiconductor layer is included in the electronic device which comprises one of a transistor, rectifier, thyristor, and cascode switch.

In accordance with another aspect of the present invention, there is provided a method of forming an electronic device comprising: providing a single crystal substrate comprised of gallium nitride having a dislocation density less than about $10^5$ per cm$^2$; homoepitaxially forming at least one semiconductor layer on the substrate, wherein the electronic device is one of a transistor, rectifier, thyristor, and cascode switch.

DETAILED DESCRIPTION OF THE PREFERRED EMBODIMENTS

Figure 1:
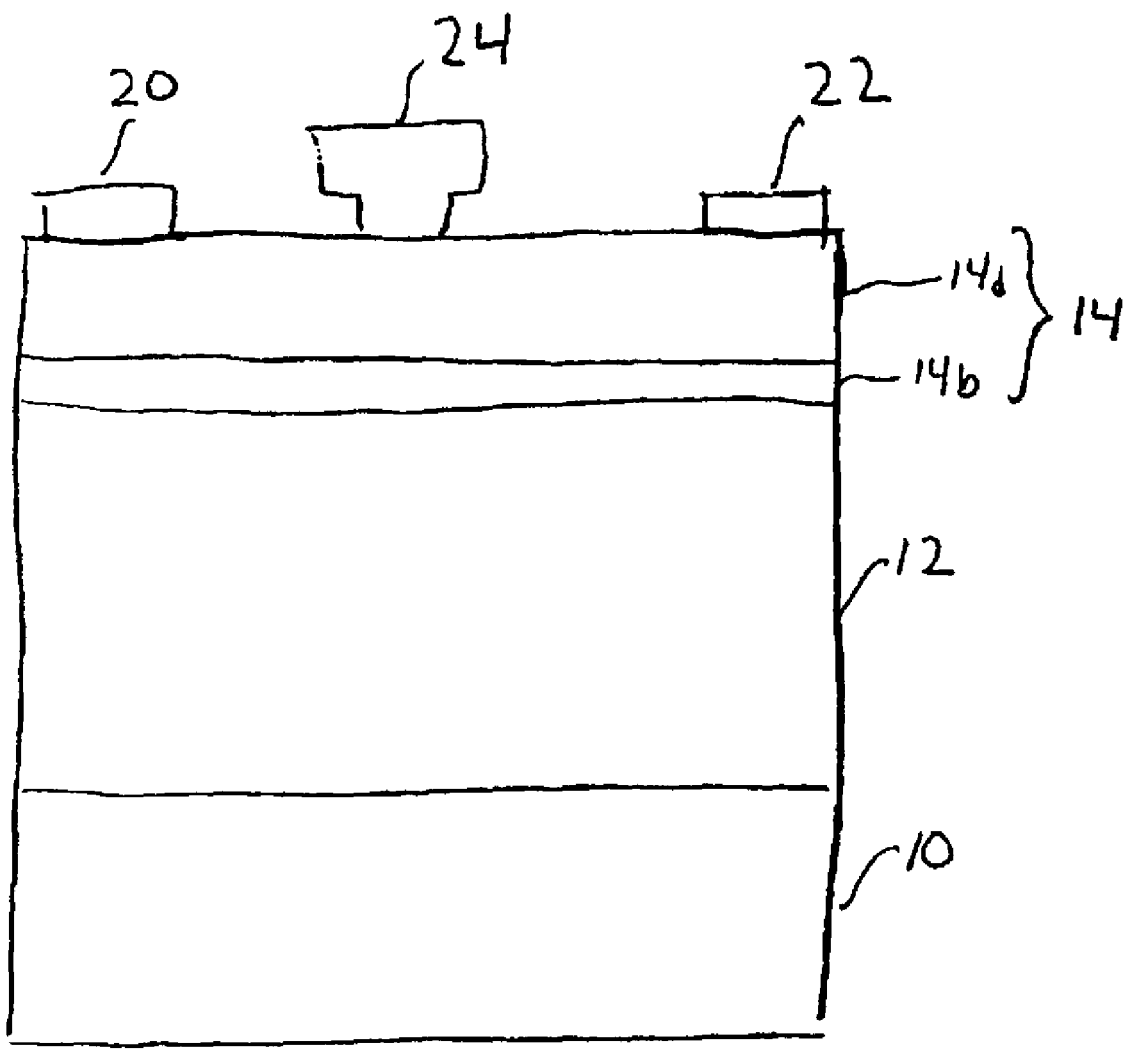
FIG. 1 is a schematic illustration of a HEMT device according to a preferred embodiment of the invention.

Substrate Preparation.

A homoepitaxial GaN based electronic device structure is formed by epitaxial growth of a number of GaN based semiconductor layers on a single crystal GaN substrate. Thus, in this application a homoepitaxial GaN based electronic device is an electronic device with a GaN substrate and at least one GaN based semiconductor layer formed on the substrate. The at least one GaN based semiconductor layer comprises $Al_xIn_yGa_{1-x-y}N$, where $0 \leq x \leq 1$, $0 \leq y \leq 1$, and $0 \leq x+y \leq 1$. In addition to the GaN based semiconductors, the homoepitaxial GaN based electronic device may have other epitaxial layers which are not GaN based, such as an AlN layer or an $Al_xIn_{1-x}N$ layer, where $0 \leq x \leq 1$. Gallium nitride-based electronic devices, such as a transistor, rectifier, or thyristor, are grown homoepitaxially directly on a high-quality single crystal gallium nitride substrate, where the substrate has a low dislocation density and a low concentration of unintentional impurities.

The GaN substrate for the device fabrication may consist of, for example, a (0001)-oriented GaN wafer cut from a boule that was grown using a supercritical solvent at a temperature greater than about 550° C. and a pressure greater than about 5 kbar.

More specifically, one suitable process for forming the GaN substrate comprises providing a source gallium nitride, solvent, and mineralizer. The source gallium nitride may comprise at least one of poorly-crystallized gallium nitride, well-crystallized gallium nitride, amorphous gallium nitride, polycrystalline gallium nitride, and combinations thereof. The source gallium nitride may be provided "as-is" in its raw form. Alternatively, the source gallium nitride can be compacted into a "pill" and/or sintered into a polycrystalline compact. Alternatively, the source gallium nitride can be formed in situ. Gallium metal may be provided, which then reacts with the ammonia solvent after sealing of the capsule and treatment at high pressure and high temperature to form source gallium nitride.

The source gallium nitride may then be combined with at least one of the mineralizer and solvent to form a mixture. The gallium nitride, solvent, and mineralizer may optionally be provided individually to the capsule as separate and distinct un-combined materials. The mixture, which can comprise gallium nitride and at least one of the solvent and mineralizer, can be optionally compacted into a pill. However the compacting of the mixture need not be conducted in the gallium nitride growth process.

The source gallium nitride, solvent, and mineralizer, whether as a mixture that is compacted or not compacted, are then placed inside a capsule. Optionally, additional mineralizer can also be added to the capsule. The capsule, which will be described hereinafter, can then be filled with a nitrogen-containing solvent, for example at least one of ammonia or hydrazine, or an organic solvent, including but not limited to, methylamine, melamine, or ethylene diamine, and mixtures thereof. The capsule is then sealed, disposed in a pressure cell, and subjected to high pressure and high temperature conditions in an appropriate high pressure high temperature (HPHT) system. The HPHT conditions are maintained for a length of time sufficient to dissolve the source gallium nitride and re-precipitate it onto at least one gallium nitride crystal, gallium nitride boule, or gallium nitride crystal seed. The resulting GaN crystal is a true single crystal, originating from a single seed rather than being formed by coalescence of multiple growth centers, and is free of grain boundaries, tilt boundaries, and the like.

Maintaining HPHT conditions yields large single gallium nitride crystals, for example single gallium nitride crystals having a diameter and thickness in a range from about 0.02 inch (about 0.05 cm) to about 12 inches (about 30 cm), for example a size in a range from about 2 inches to about 6 inches. The pressure may be in a range from greater than about 5 kbar to about 80 kbar, and the temperature for the gallium nitride crystal growth process is in a range between about 550° C. and about 3000° C. The GaN single crystals thus formed are substantially transparent, with an optical absorption coefficient below 100 $cm^{-1}$.

The HPHT system is then allowed to cool and the high pressure is relieved. The gallium nitride crystals are removed from the HPHT system and pressure cell and washed in water and mineral acids. The mineral acids for washing the gallium nitride crystals include, but are not limited to, hydrochloric acid (HCl) and nitric acid ($HNO_3$).

The mineralizers may comprise at least one of alkali and alkaline-earth nitrides, such as at least one of $Li_3N$, $Mg_3N_2$, and $Ca_3Na_2$; amides, such as $LiNH_2$, $NaNH_2$, and $KNH_2$; urea and related compounds, ammonium salts, such as $NH_4F$ and $NH_4Cl$; halide, sulfide, and nitrate salts, such as NaCl, $CeCl_3$, $Li_2S$, and $KNO_3$; lithium salts, and combinations thereof. The mineralizers may be provided as solids or as additives dissolved in fluids, such as solvents. The use of alkaline-earth or rare-earth mineralizers have the additional advantage of acting as a getter for adventitious oxygen in the growth medium, allowing for the growth of undoped GaN crystals with low n-type carrier density. Alternatively, the mineralizer can be formed in situ. At least one of lithium, sodium, potassium, rubidium, cesium, magnesium, calcium, strontium, barium, or a rare-earth metal may be provided, which then react with the ammonia solvent to form the mineralizer.

The filling and sealing steps will now be described. The capsule is filled with a nitrogen-containing solvent, for example at least one of ammonia or hydrazine or an organic solvent, including, but not limited to methylamine, melamine, or ethylenediamine, without admitting air or water, which are undesirable in the gallium nitride formation process. To fill the capsule without admitting air or water, the capsule is filled and connected to a negative pressure source, such as a vacuum manifold, and evacuated. The capsule is then chilled to a temperature below room temperature (preferably about −72° C. or below) and vapor-phase solvent can be admitted to the manifold. The vapor-phase solvent then condenses in the capsule. For example, if the nitrogen-containing solvent comprises ammonia, the condensation can be performed at dry ice or liquid-nitrogen temperatures.

The capsule can then be isolated so as to seal the capsule by closing a valve to the negative pressure source. The capsule can then be separated from at least one of the manifold or the valve by a pinching-off step using a cold welding apparatus, which is well known in the art. The pinching-off step is particularly effective if the capsule is copper. The integrity of the seal may be enhanced by optional arc-welding.

The capsule and pressure cell comprise any appropriate form that permit the gallium nitride growth process to withstand the high pressure and high temperature as embodied by the invention. The HPHT system that applies the high pressures and high temperatures can comprise a press device, which may include at least one of a die and punch. For example, the press device may comprise one of a piston-cylinder press; a belt press; a tetrahedral-, cubic-, or octahedral-anvil press; a recessed-anvil press; and a toroid-type press, each of which are known to those of skill in the art. Preferred capsules and pressure cells are described in U.S. patent application Ser. Nos. 09/683,659 and 09/683,658, respectively, filed on Jan. 31, 2002, which are hereby incorporated by reference in their entirety.

The foregoing description of the process for forming the GaN single crystal substrate is intended to be illustrative only, and should not be construed in any limiting sense. Other methods for forming the single crystal will be obvious to those skilled in the art, but are intended to fall within the scope of the present disclosure.

The GaN crystal formed is of high quality as determined by a measurement of dislocation density. The dislocation density may be determined by performing transmission electron microscopy (TEM) on a thin section, as is well known in the art. The GaN crystal formed contains less than $10^5$ threading dislocations per $cm^2$, preferably less than $10^3$ dislocations per $cm^2$, and most preferably less than $10^2$ dislocations per $cm^2$.

The GaN single crystal may also be formed by other methods, such as the methods described in U.S. patent application entitled "IMPROVED GALLIUM NITRIDE CRYSTAL AND METHOD FOR MAKING", 10/329,982, filed concurrently with the present application. U.S. patent application entitled "IMPROVED GALLIUM NITRIDE CRYSTAL AND METHOD FOR MAKING", 10/329,982, is hereby incorporated by reference in its entirety. In order to keep the concentration of undesired dopants, such as oxygen, to an acceptable level, the impurity levels in the raw materials (source gallium nitride, mineralizer, and solvent) and capsules must be limited to appropriately low levels. For example, an oxygen concentration in the grown crystals below $3\times10^{18}$ $cm^{-3}$ may be achieved by holding the total oxygen content in the raw materials and capsule below 15 parts per million, expressed with respect to the weight of the final crystal, and an impurity level below $3\times10^{17}$ $cm^{-3}$ may be achieved by holding the total oxygen content in the raw materials and capsule below 1.5 parts per million.

After the crystal has been formed, the substrate or wafer for the device fabrication is cut from a boule. The wafer may comprise single crystal semi-insulating GaN, with an electrical resistivity greater than about $10^5$ Ω-cm. The orientation used for growth is (0001) Ga in the preferred embodiment. The wafer has a dislocation density less than about $10^5$ $cm^2$, or more preferably below about $10^3$ $cm^2$. Furthermore, the substrates formed may have carrier mobilities above about 100 $cm^2$/V-s and strain, with respect to undoped GaN homoepitaxial layers, below about 0.005%. The substrate is polished to a mirror finish using mechanical-polishing techniques that are well known in the art.

Subsurface damage on the wafer left over from the polishing process is removed by methods that are well known in the art, such as chemically-assisted ion beam etching or chemo-mechanical polishing. Residual damage may also be removed by heating the wafer to a temperature between about 900 and 1500° C. in an atmosphere containing ammonia at a partial pressure between 1 and 20,000 bar.

Device fabrication.

Embodiments of the present invention are described below in detail with reference to the accompanying drawings. The same reference numerals denote the same parts throughout the drawings.

The active device structure may be fabricated by molecular beam epitaxy (MBE) or metalorganic vapor-phase epitaxy (MOVPE), also known as OMVPE or MOCVD. These deposition procedures are known in the art.

The wafer or substrate 10 is placed in a growth reactor (not shown), which is then evacuated. Residual surface defects are annealed, or adventitious contaminants removed, by heating the wafer to a temperature between about 900 and 1200° C. in an atmosphere containing ammonia at a partial pressure between $10^{-6}$ mbar and 1 bar.

The device structure is formed by homoepitaxial deposition of a number of GaN based semiconductor layers. Thus, at least one GaN based semiconductor layer is formed on the substrate 10. Each layer in the structure is formed by condensation of atomic species such as Ga, Al, In, and Si, or decomposition of organometallic precursors in a nitrogen-containing atmosphere on the substrate surface. The nitrogen-containing atmosphere preferentially includes nitrogen, ammonia or hydrazine and may be partially or completely decomposed before contact with the substrate surface. A carrier gas such as $H_2$ or He may be used.

Suitable organometallic precursors for MOVPE include, but are not limited to, trimethylgallium, $Ga(CH_3)_3$, trimethylaluminum, $Al(CH_3)_3$, and trimethylindum, $In(CH_3)_3$. Suitable dopant precursors (if the layer is to be doped) include but are not limited to silane, $SiH_4$, for n-type material, and bis-(cyclopentadienyl)magnesium ($Mg(c-C_5H_5)_2$) or dimethyl zinc, $Zn(CH_3)_2$, for p-type material. After the annealing step to reduce residual surface damage, further layers of the electronic device structure are formed. The embodiments described below all comprise (i) a single-crystal GaN substrate; (ii) at least one epitaxial GaN based layer; and (iii) at least two electrical contacts.

Figure 2:
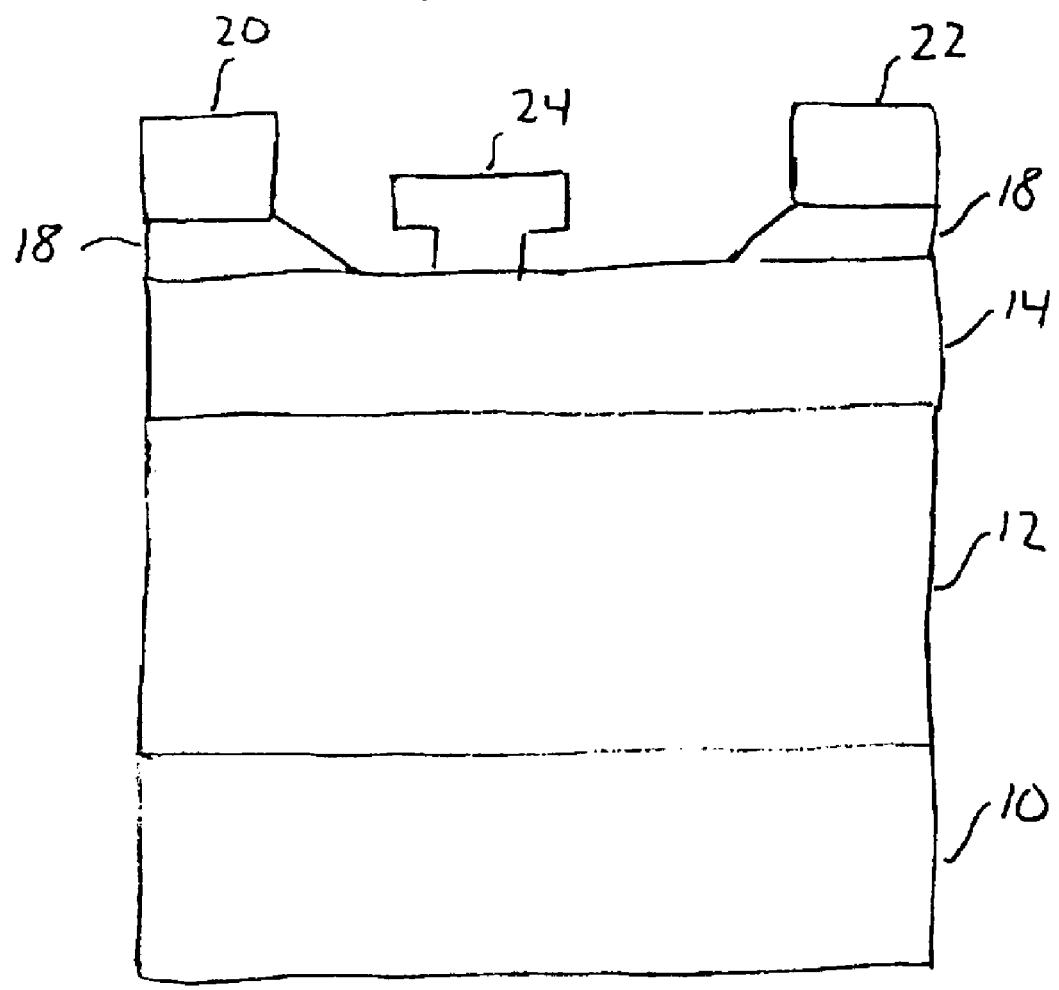
FIG. 2 is a schematic illustration of a HEMT device according to another preferred embodiment of the invention.
Figure 3:
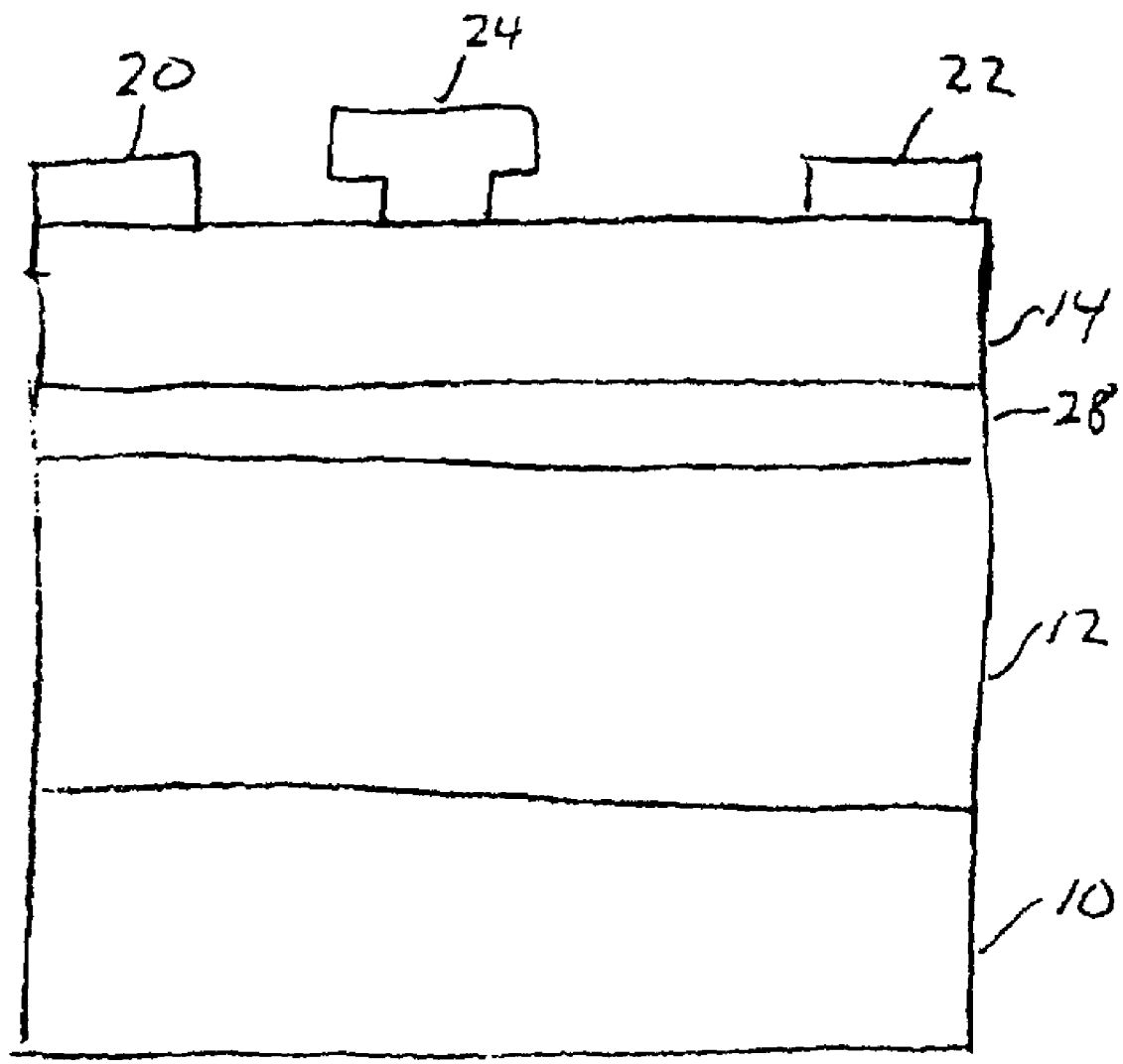
FIG. 3 is a schematic illustration of a HEMT device according to another preferred embodiment of the invention.

FIGS. 1-3 illustrate HEMT devices according to embodiments of the invention. FIG. 1 illustrates a first embodiment of a HEMT. After the annealing step described above, a buffer layer 12 is formed on the substrate 10. In this application, buffer layer has a different meaning than the "buffer layer" often described in the GaN device art, which is a poorly-crystallized layer that acts as a transition layer between a non-GaN substrate such as sapphire or SiC and an epitaxial GaN layer. The buffer layer 12 may be, for example, $Al_x In_y Ga_{1-x-y}N$, wherein $0 \leq x$, $y \leq 1$, $0 \leq x+y \leq 1$. Most preferably the buffer layer 12 comprises undoped GaN. The buffer layer 12 may have a thickness between about 300 nm and 20 µm, or more preferably between 1 and 3 µm. In the embodiment of FIG. 1 (and of FIG. 2 described below) the buffer layer 12 will contain a two-dimensional electron gas (2DEG) and act as a channel layer. The carrier concentration in the buffer layer 12 is preferably below $5\times10^{16}$ $cm^{-3}$, and more preferably below $10^{15}$ $cm^{-3}$. Optionally, the outermost portion of the substrate 10 itself can be utilized as the 2DEG region.

After the buffer layer 12 is formed, a barrier layer 14 is formed on the buffer layer 12. The barrier layer 14 has a wider bandgap than the buffer layer 12. The barrier layer 14 may comprise $Al_xIn_yGa_{1-x-y}N$, wherein $0 \leq x$, $y \leq 1$, $0 \leq x+y \leq 1$, and may comprise for example, $Al_xGa_{1-x}N$, where $x \approx 0.2$-$0.3$. The incorporation of In into the $Al_xIn_yGa_{1-x-y}N$ barrier layer, with $y \approx 0.22 \, x$, enables the barrier layer 14 to be approximately lattice matched to the GaN buffer layer 12 despite having a larger bandgap. The barrier layer may also comprise two sub barrier layers 14a and 14b. For example, the sub barrier layer 14b may be formed on the buffer layer 12 and may be AlN and the sub barrier layer 14a may be formed on the sub barrier layer 14b and may be AlGaN. The sub barrier layer 14b is a higher-bandgap layer than the sub barrier layer 14a, and may have, for example, a thickness between about 0.6 and 1.5 nm.

The barrier layer 14 may have a thickness between 5 nm and 50 nm, or more preferably between 15 and 25 nm.

A source contact 20, drain contact 22 and gate contact 24 are formed on the top surface of the device. The source contact 20 and the drain contact 22 are deposited on either side of the device as ohmic contacts to form the source and the drain regions. Suitable compositions for the source and drain contacts 20 and 22 include Ti/Al/Ti/Au, Ti/Al/Ni/Au, and Ti/Al/Pt/Au stacks, wherein each layer of the stack is between about 10 and about 500 nm thick. The first Ti layer is preferably between 10 and 30 nm thick, the Al layer between 50 and 300 nm thick, and the outermost layers between 30 and 70 nm thick. Deposition may be achieved, for example, by electron beam evaporation, thermal evaporation, or other techniques.

The source and drain contacts 20 and 22 may have, for example, a length between about 50 and 1000 μm. The width of the source and drain contacts 20 and 22 may be between about 20 and 200 μm, or more preferably between about 40 and 100 μm. The separation between the source and drain contacts 20 and 22 may be between about 0.2 μm and about 10 μm, or more preferably between 0.5 and 2 μm.

Following the deposition of the source and drain contacts 20 and 22, the structure is annealed, at a temperature between about 500° C. and 950° C., or preferably between about 750 and 870° C., in order to achieve an ohmic contact.

The gate contact 24 is deposited between the source and the drain contacts on top of the barrier layer 14 as a Schottky gate. The length of the gate contact 24 may be between about 20 and 1000 μm, or more preferably between about 50 and 500 μm, and the width may be between about 50 nm and 1 μm. Suitable compositions for the gate contact 24 include Ni/Au and Pt/Au stacks, wherein the first layer of the stack is between about 20 and 200 nm and the Au layer is between about 100 and 1000 nm thick. Deposition may again be achieved by electron beam evaporation, thermal evaporation, or other techniques. The structure is not annealed, so as to retain Schottky rectification behavior.

The HEMT of FIG. 2 is similar to that of FIG. 1. The HEMT of FIG. 2, however, includes a contact layer 18 formed between the source and drain contacts 20 and 22 and the barrier layer 14, and a trench formed in the contact layer 18 to expose the barrier layer 14, with the gate contact 24 formed on the barrier layer 14. The contact layer 18 may comprise n-doped $Al_xIn_yGa_{1-x-y}N$, wherein $0 \leq x$, $y \leq 1$, $0 \leq x+y \leq 1$, and may comprise for example n-type GaN with a carrier concentration greater than about $2 \times 10^{18}$ cm$^{-3}$. The contact layer 18 may have a thickness, for example, of between 10 and 200 nm. The contact layer 18 is less oxidation prone than the barrier layer 14, due to a reduced Al concentration, and also forms more reliable ohmic contacts.

The HEMT of FIG. 3 is similar to that of FIG. 1. The HEMT of FIG. 3, however, includes a channel layer 28 formed between the buffer layer 12 and the barrier layer 14. The channel layer 28 has a narrower bandgap than the buffer layer 12 and will contain the 2DEG. The channel layer 28 may comprise $Al_xIn_yGa_{1-x-y}N$, wherein $0 \leq x$, $y \leq 1$, $0 \leq x+y \leq 1$, and may be $In_xGa_{1-x}N$, where $x \approx 0.05$-$0.15$. The channel layer 28 may have a thickness between 3 nm and 20 nm, or more preferably between 5 and 10 nm.

Figure 4:
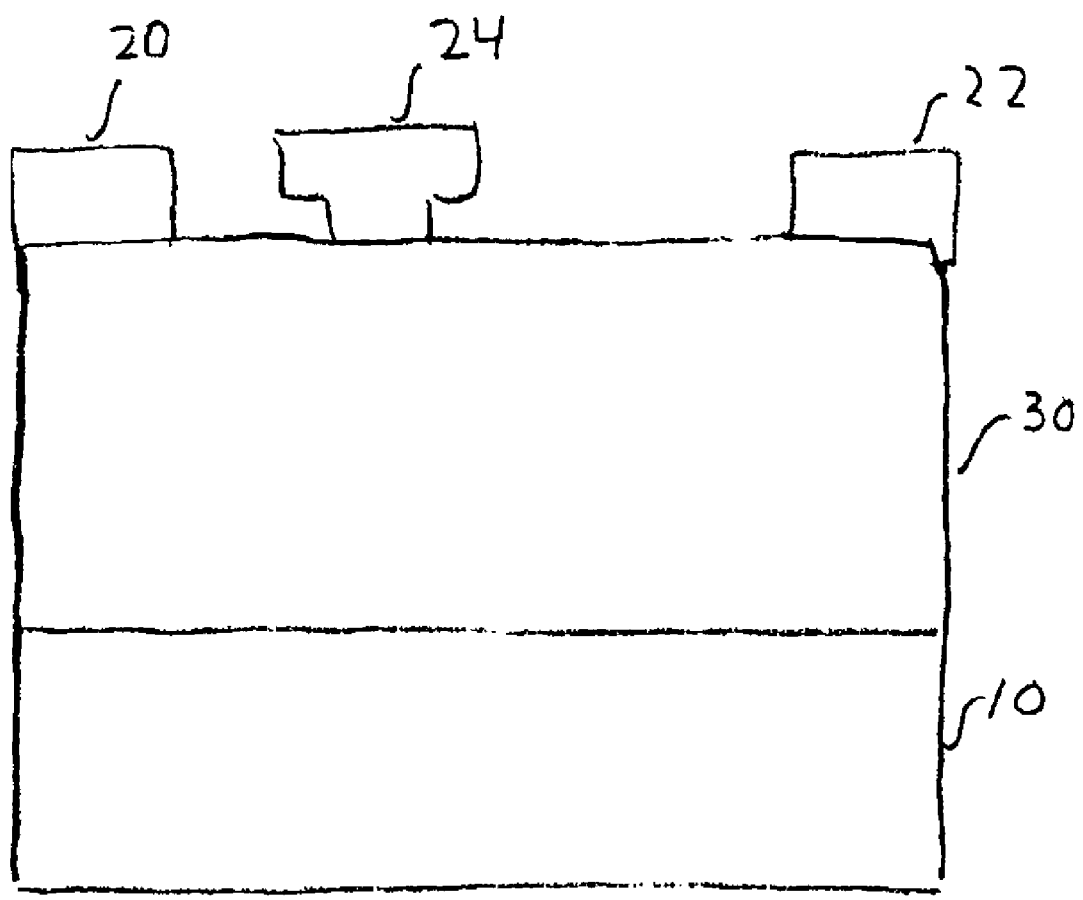
FIG. 4 is a schematic illustration of a MESFET device according to another preferred embodiment of the invention.

FIG. 4 illustrates an embodiment where the device is a MESFET. The MESFET device is essentially a simplified version of the HEMT, wherein GaN is used throughout the semiconductor structure and there is no barrier layer. A GaN channel layer 30 is formed on the GaN substrate 10. The source, drain and gate contacts 20, 22 and 24 may be formed in a similar fashion to that described with respect to FIG. 1. Optionally, the ohmic contacts are improved by means of a contact layer (not shown) analogous to that shown in FIG. 2 or, more simply, by ion implantation of an n-type dopant such as Si into the region directly below the source and drain contacts 20 and 22. The MESFET may have somewhat inferior performance characteristics as compared to the HEMT but is simpler and cheaper to fabricate.

Figure 5:
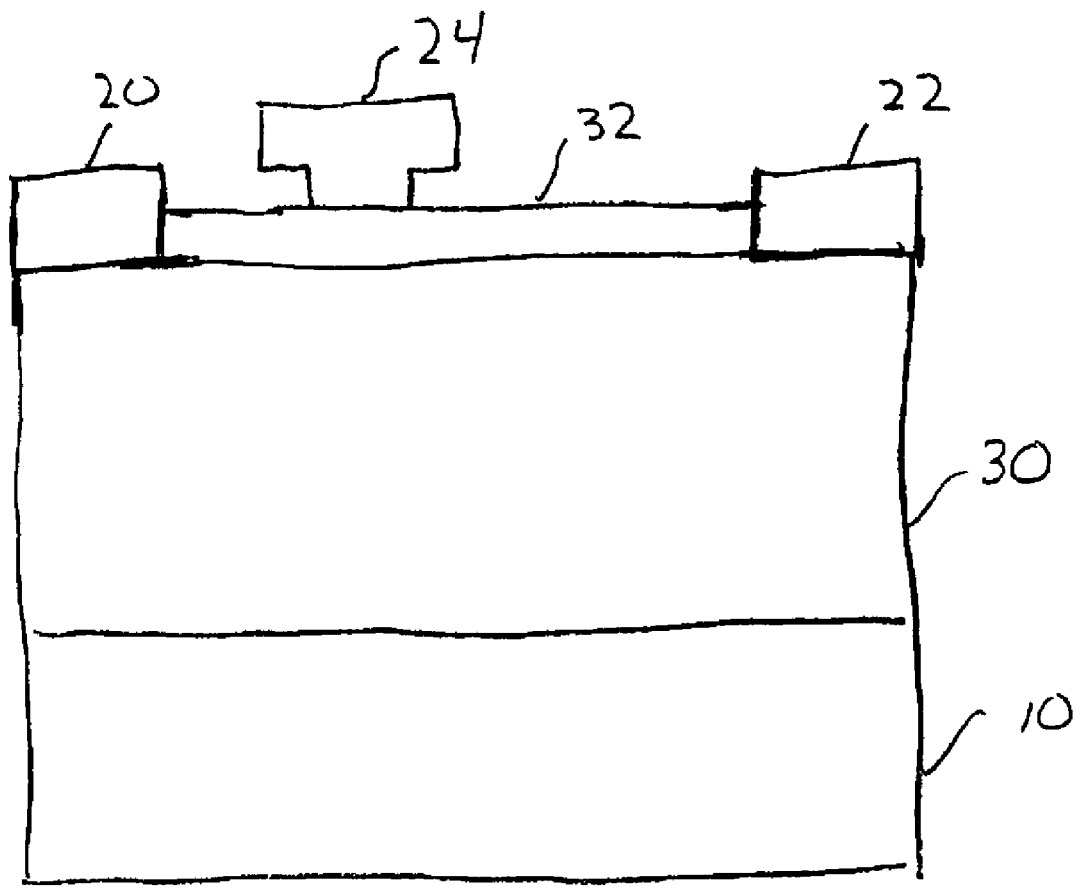
FIG. 5 is a schematic illustration of a MOSFET or MISFET device according to another preferred embodiment of the invention.

In another embodiment, shown in FIG. 5, the device is a MOSFET or MISFET. The MOSFET/MISFET is similar in structure to the MESFET of the embodiment of FIG. 4, except that the gate contact 24 is separated from the channel layer 30 by an insulating layer 32, an oxide for a MOSFET or an insulating dielectric for a MISFET. The MOSFET/MISFET is particularly suitable for power electronic applications, as the presence of the oxide or insulator layer protects the GaN layer from oxidation during operation at high currents and/or elevated temperatures. Suitable compositions for the oxide of the insulating layer 32 for a MOSFET include at least one of $SiO_2$, $Sc_2O_3$, MgO, $Ga_2O_3$, and $R_2O_3$, where R is a rare-earth element such as Gd. Suitable compositions for an insulating dielectric insulating layer 32 for the MISFET include AlN and $Si_3N_4$. An oxide or insulating layer may also be used to separate the gate from the barrier layer in the HEMT structure of FIG. 1.

Figure 6:
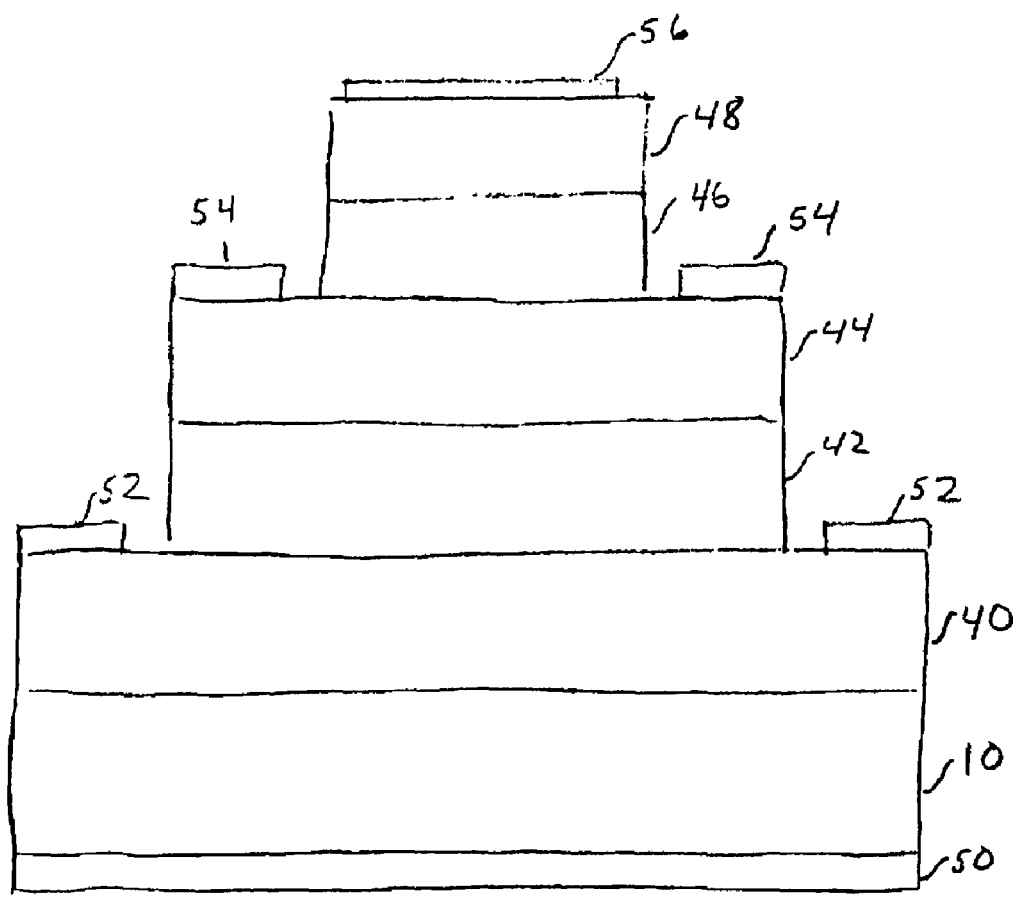
FIG. 6 is a schematic illustration of a HBT device according to another preferred embodiment of the invention.

In another embodiment, shown in FIG. 6, the device is an HBT. HBTs are particularly useful for the highest-frequency applications of GaN devices. The HBT can be fabricated in either a npn configuration or a pnp configuration. For simplicity, fabrication of only the npn configuration will be described in detail but fabrication of the pnp configuration is directly analogous with p-type layers of the npn substituted with n-type layers of the pnp configuration and vice versa. The substrate 10 may be a bulk GaN substrate which is semi-insulating, and may have a resistivity greater than $10^5$ Ω-cm. The substrate 10 may also be n-type, preferably with a carrier concentration greater than about $2 \times 10^{18}$ cm$^{-3}$.

A collector layer 42 is formed over the substrate 10. The collector layer 42 may be an n-type layer of $Al_xIn_yGa_{1-x-y}N$, wherein $0 \leq x$, $y \leq 1$, $0 \leq x+y \leq 1$, with a thickness between 200 nm and 5000 nm, or more preferably between 400 and 800 nm. The collector layer 42 may comprise n-GaN or n-$Al_xGa_{1-x}N$, wherein $0 \leq x \leq 1$ and is doped with a carrier concentration between about $1 \times 10^{16}$ and about $5 \times 10^{16}$ cm$^{-3}$.

Optionally, a subcollector layer 40 may be formed between the collector layer 42 and the substrate 10, particularly when substrate 10 is semi-insulating. The subcollector layer 40 may comprise, for example, n$^+$ doped GaN. The thickness of the subcollector layer 40 may be between about 0.2 and 5 μm, or preferably between about 1 and 2 μm, and may have a carrier concentration greater than about $2 \times 10^{18}$ cm$^{-3}$. Subcollector contacts 52, which may be ohmic, are formed on the top surface of the subcollector layer 40. The purpose of the subcollector layer 40 is to improve the performance of the ohmic subcollector contact 52 and, in the case of a semi-insulating substrate, to provide an ohmic contact to the collector layer.

A base layer 44 is formed on the collector layer 42. The base layer 44 may comprise p-type $Al_xIn_yGa_{1-x-y}N$, wherein $0 \leq x$, $y \leq 1$, $0 \leq x+y \leq 1$, with a thickness between 10 nm and 1000 nm, or more preferably between 50 and 200 nm. The base layer 44 may comprise $p^+$-GaN doped with a carrier concentration above about $2\times10^{18}$ cm$^{-3}$. The base layer 44 may also be graded from GaN, at the contact with the collector layer, to $Al_xGa_{1-x}N$ with x≈0.05 near the top surface of the base layer 44. Alternatively, a $p$-$Al_xGa_{1-x}N$/GaN superlattice may be deposited on the top surface of the base layer 44.

An emitter layer 46 is formed on the base layer 44. The emitter layer 46 may comprise n-type $Al_xIn_yGa_{1-x-y}N$, wherein $0 \leq x$, $y \leq 1$, $0 \leq x+y \leq 1$, with a thickness between 0.5 nm and 1000 nm, or more preferably between 50 and 300 nm. The emitter layer 46 has as wider bandgap than the base layer 44. Typically, the emitter layer 46 comprises $n$-$Al_xGa_{1-x}N$, wherein $0.15 \leq x \leq 0.25$ and may be doped with a carrier concentration $>2\times10^{18}$ cm$^{-3}$. Optionally, the composition of the emitter layer 46 is graded from $n$-$Al_xGa_{1-x}N$ with x≈0.05, at the contact to the base layer 44 to n-GaN near the top surface of the emitter layer 46.

A cap layer 48 is formed on the emitter layer 46. The cap layer 48 may comprise $n^+$-GaN, with a thickness of about 100 nm and a carrier concentration greater than about $2\times10^{18}$ cm$^{-3}$. The layers are etched to expose the base layer 44 and, if a top-facing collector contact is desired, a deeper via is etched to expose the subcollector layer 40.

Collector, base, and emitter contacts 52, 54 and 56 are formed. The contacts are preferably ohmic metallic contacts. The emitter contact 56 is deposited on top of the cap layer 48, and the base contact 54 is deposited on the base layer 44 after etching to expose the latter. In one embodiment a collector contact 52 is deposited on the subcollector layer 40, as described above. In another embodiment, the bulk GaN substrate is n-type, with a carrier concentration greater than about $2\times10^{18}$ cm$^{-3}$, and a collector contact 50 is deposited on the back surface of the substrate 10, opposite the device structure. Suitable compositions for the n-type collector and emitter contacts include Ti/Al/Ti/Au, Ti/Al/Ni/Au, and Ti/Al/Pt/Au stacks, wherein each layer of the stack is between about 10 and about 500 nm thick, and deposition is achieved by electron beam evaporation, thermal evaporation, or other techniques. The first Ti layer is preferably between 10 and 30 nm thick, the Al layer between 50 and 300 nm thick, and the outermost layers between 30 and 70 nm thick. Suitable compositions for the p-type contacts (contacts to the p-type layers) include Ni/Au and Pt/Au stacks, wherein the first layer is between about 20 and 200 nm and the Au layer is between about 100 and 1000 nm thick. Following the depositions the structure is annealed, at a temperature between about 500° C. and 950° C., or preferably between about 750 and 870° C., in order to achieve an ohmic contact.

As mentioned above, a pnp HBT may be formed by substituting the p-type layers of the pnp HBT with the n-type layers of the npn HBT and vice versa.

Figure 7:
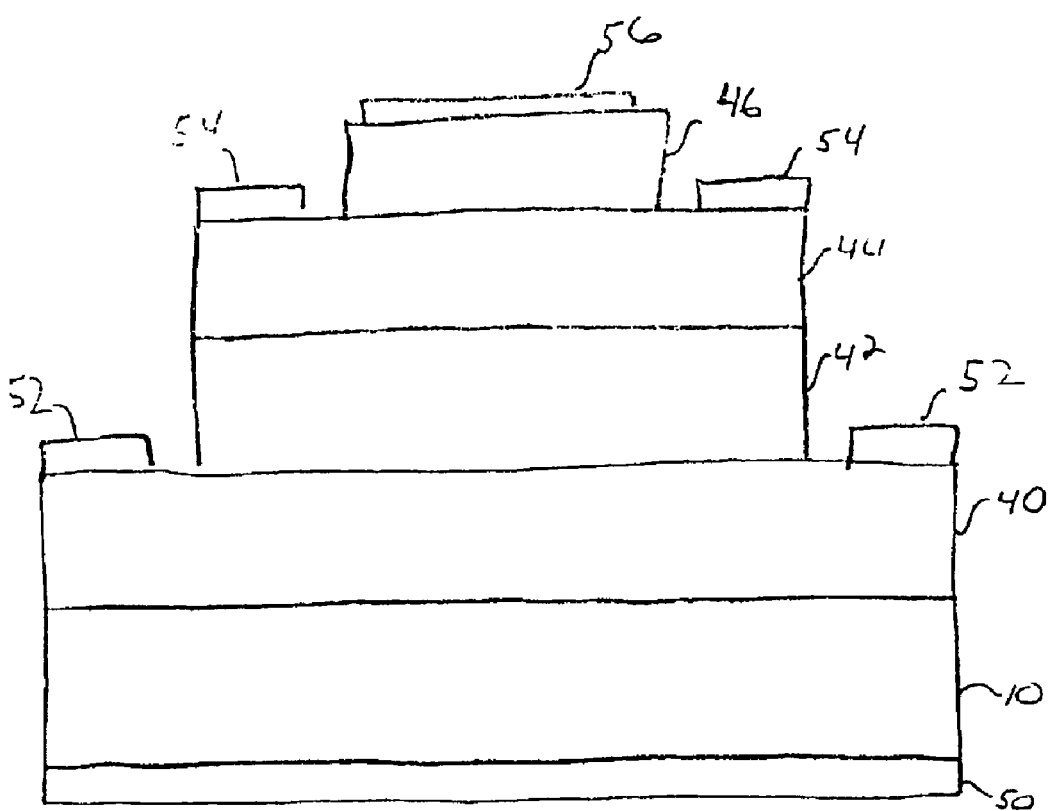
FIG. 7 is a schematic illustration of a BJT device according to another preferred embodiment of the invention.

FIG. 7 illustrates another embodiment, where the device is a BJT. The BJT device of FIG. 7 is similar to the HBT of FIG. 6. The BJT structure is a simplified version of the HBT, in which unalloyed GaN comprises all the semiconductor layers. Thus, the BJT device of FIG. 7 is the same as the device of FIG. 6, except that unalloyed GaN is substituted for alloyed GaN layers.

Figure 8:
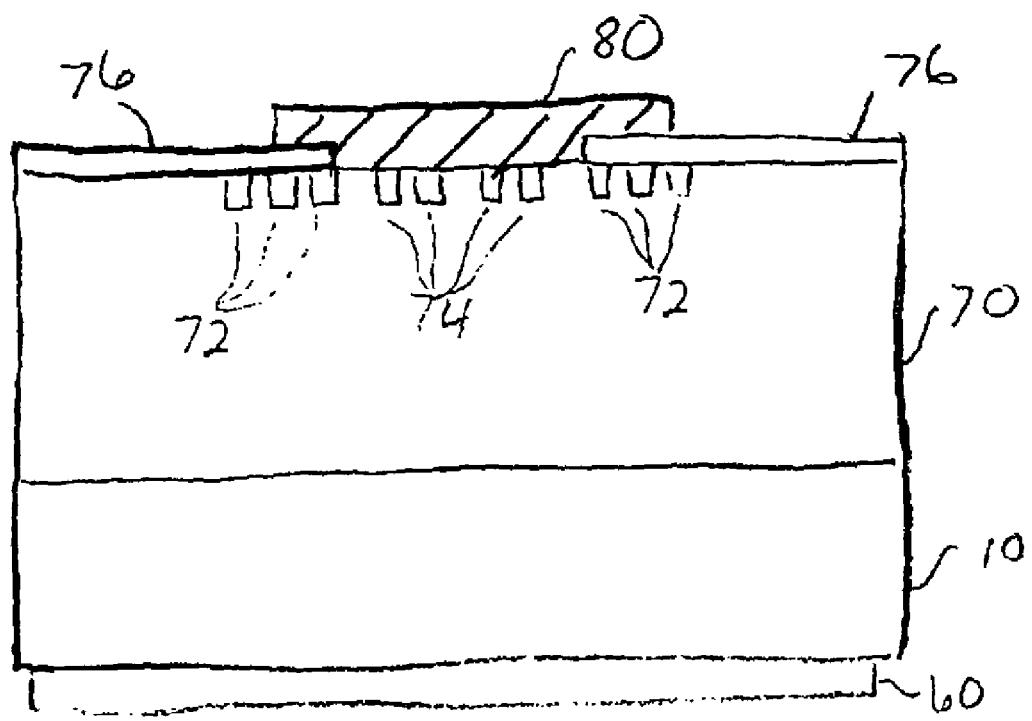
FIG. 8 is a schematic illustration of a Schottky rectifier device according to another preferred embodiment of the invention.

FIG. 8 illustrates another embodiment, where the device is a Schottky rectifier. The Schottky rectifier includes a GaN substrate 10. The GaN substrate 10 may be n-type, preferably with a carrier level greater than about $2\times10^{18}$ cm$^{-3}$. A voltage blocking layer 70 is formed on the substrate 10. The voltage blocking layer 70 may comprise undoped $Al_xIn_yGa_{1-x-y}N$, wherein $0 \leq x$, $y \leq 1$, $0 \leq x+y \leq 1$, with a thickness between 1 and 500 μm, or more preferably between 50 and 200 μm. The voltage blocking layer 70 has greater thickness for higher blocking voltage requirements. The carrier concentration in the voltage blocking layer 70 is preferably low, for example below $5\times10^{16}$ cm$^{-3}$ and more preferably below $10^{15}$ cm$^{-3}$. Alternatively, the Schottky rectifier employs a p-type GaN substrate and p-type epilayer.

Optionally, a series of guard rings 72 and junction barrier control rings 74 are formed on the voltage blocking layer 70. The purpose of the guard rings 72 is to reduce electric field crowding at the boundary of the subsequently formed oxide and contact and to increase the blocking voltage. The guard rings 72 and junction barrier control rings 74 may be formed on the voltage blocking layer 70 by ion implantation, for example. The ions for implanting may be Mg or Zn, for example. The carrier level in the region of the rings is preferably greater than about $2\times10^{17}$ cm$^{-3}$.

An insulator layer 76 is formed on the voltage blocking layer 70. The insulator layer 76 may comprise, for example, at least one of $SiO_2$, $Sc_2O_3$, MgO, $Ga_2O_3$, and $R_2O_3$, where R is a rare-earth element such as Gd. The insulator layer 76 covers the guard rings 72, but not the junction barrier control rings 74.

A voltage blocking layer contact 80 and substrate contact 60 are formed respectively on the voltage blocking layer 70 and the substrate 10. The substrate contact 60 is preferably an n-type contact (contacting an n-type layer) and may comprise a sequence of layers such as a Ti/Al/Ti/Au, Ti/Al/Ni/Au, or Ti/Al/Pt/Au stack, wherein each layer is between about 10 and about 500 nm thick. The deposition of the substrate contact 60 may be achieved, for example, by electron beam evaporation, thermal evaporation, or other techniques. The first Ti layer is preferably between 10 and 30 nm thick, the Al layer between 50 and 300 nm thick, and the outermost layers of the contact 60 between 30 and 70 nm thick.

Following the deposition of the contact 60 the structure is annealed, at a temperature between about 500° C. and 950° C., or preferably between about 750 and 870° C., in order to achieve an ohmic contact.

Suitable compositions for the voltage blocking layer contact 80 include Ti/Pt/Au, Ni/Au and Pt/Au stacks, wherein the first layer(s) is(are) between about 20 and 200 nm and the Au layer is between about 100 and 1000 nm thick. After the voltage blocking layer contact 80 is formed, the device structure is not annealed at high temperature, so as to retain Schottky contact characteristics.

Figure 9:
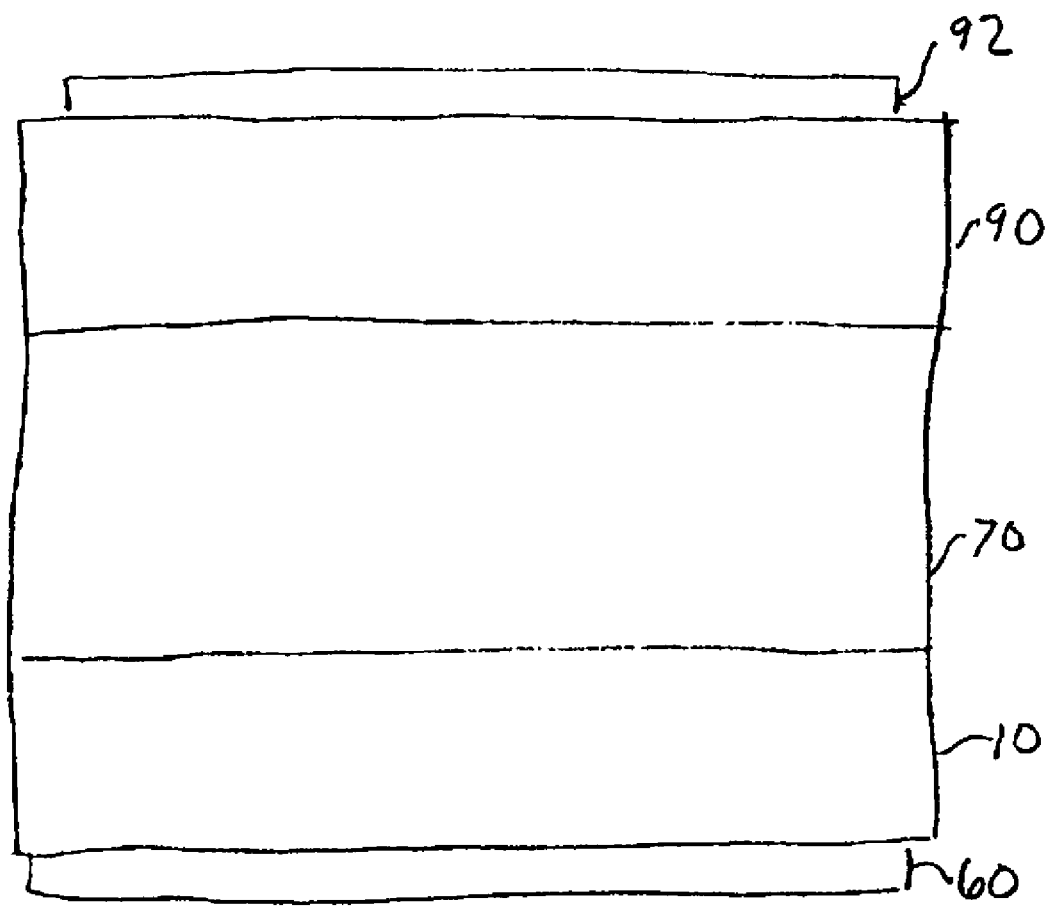
FIG. 9 is a schematic illustration of a p-i-n rectifier device according to another preferred embodiment of the invention.

FIG. 9 illustrates another embodiment of the invention where the device is a p-i-n rectifier. The device structure of the p-i-n rectifier of FIG. 9 is similar to that of the Schottky rectifier of FIG. 8 described above. Optionally, the p-i-n rectifier of FIG. 9 also includes guard rings on the voltage blocking layer 70 and an insulating layer analogous to those in FIG. 8. Contact layer 90 is formed directly on the voltage blocking layer 70. The contact layer 90 may comprise, for example, p-GaN. The contact layer 90 may have a thickness, for example, of between about 100 and 1000 nm, and more preferably between about 300 and about 700 nm. The contact layer 90 may have a carrier concentration greater than about $2\times10^{18}$ cm$^{-3}$.

The p-i-n rectifier of FIG. 9 also includes a substrate contact 60 in a similar fashion to the device of FIG. 8, which may be an n-type contact. The p-i-n rectifier of FIG. 9 also includes an ohmic contact layer contact 92.

Suitable compositions for the contact layer contact 92 include, for example, Ni/Au and Pt/Au stacks, wherein the first layer is between about 20 and 200 nm and the Au layer is between about 100 and 1000 nm thick. Following the depositions of the substrate contact 60 and the contact layer contact 92, the structure is annealed at a temperature between about 500° C. and 950° C., or preferably between about 750 and 870° C., in order to achieve ohmic contacts.

Figure 10:
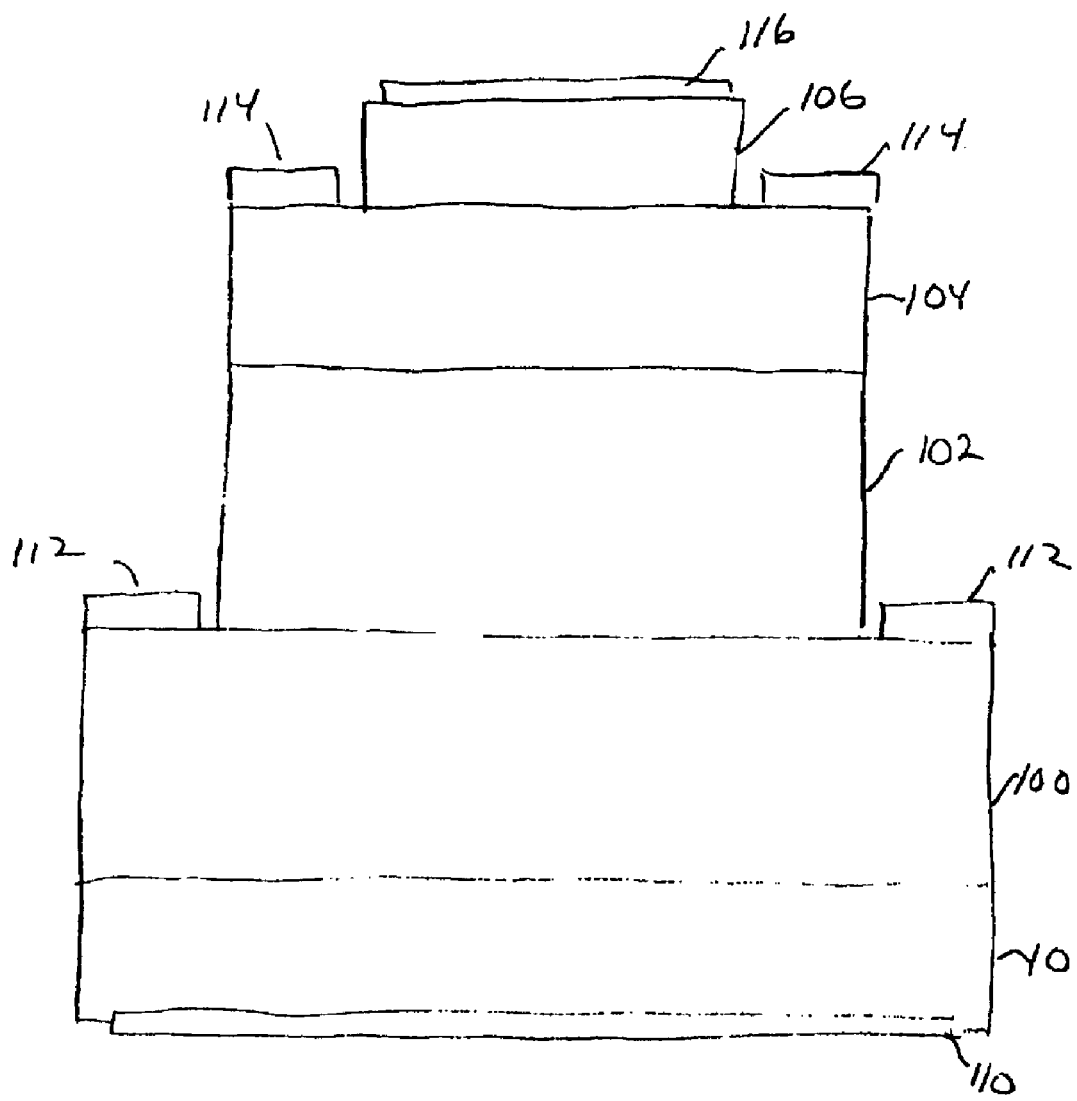
FIG. 10 is a schematic illustration of a thyristor device according to another preferred embodiment of the invention.

FIG. 10 illustrates another embodiment of the invention where the device is a thyristor. The thyristor can be fabricated in either a npn(N)p configuration, or a pnp(P)n configuration. For simplicity, fabrication of only the npn(N)p configuration will be described in detail but fabrication of the pnp(P)n configuration is directly analogous. The pnp(P)n configuration may be formed by substituting the p-type layers with a corresponding n-type layer of the npn(N)p configuration and vice versa.

The thyristor of FIG. 10 includes a GaN substrate 10. The GaN substrate 10 may be semi-insulating, with a resistivity greater than $10^5$ Ω-cm, or may be n-type, preferably with a carrier level greater than about $2 \times 10^{18}$ cm$^{-3}$.

A voltage blocking layer 102 is formed over the substrate 10. The voltage blocking layer 102 may be an undoped layer of $Al_xIn_yGa_{1-x-y}N$, wherein $0 \leq x$, $y \leq 1$, $0 \leq x+y \leq 1$, with a thickness between 1 and 500 µm, or more preferably between 50 and 200 µm. The voltage blocking layer 102 has greater thickness for higher blocking voltage requirements. The carrier concentration in the voltage blocking layer 102 is preferably low, for example below $5 \times 10^{16}$ cm$^{-3}$ and more preferably below $10^{15}$ cm$^{-3}$.

In the case where substrate 10 is semi-insulting, a first doped layer 100 may be optionally formed between the substrate 10 and the voltage blocking layer 102. The first doped layer 100 may be a n$^+$ doped GaN layer deposited on the substrate 10, with a thickness between about 0.2 and 5 µm or preferably between about 1 and 2 µm, and a carrier concentration greater than about $2 \times 10^{18}$ cm$^{-3}$. If the bulk GaN substrate 10 is semi-insulating, doped layer contacts 112 are made on the top surface of the first doped layer 100. The purpose of the first doped layer 100 is to improve the performance of the ohmic contact of the contacts to the substrate 10 and, in the case of a semi-insulating substrate, to provide an electrical contact.

A second doped layer 104 is formed on the voltage blocking layer 102. The second doped layer 104 may comprise, for example, n-type $Al_xIn_yGa_{1-x-y}N$, wherein $0 \leq x$, $y \leq 1$, $0 \leq x+y \leq 1$, with a thickness between 100 nm and 3000 nm, or more preferably between 500 and 700 nm. The second doped layer 104 may have a carrier concentration of about $2 \times 10^{17}$ cm$^{-3}$. The second doped layer 104 may comprise n-GaN. Optionally, a n-$A_xGa_{1-x}$N/GaN superlattice may be deposited on the top surface of the second doped layer 104.

A cap layer 106 is formed on the second doped layer 104. The cap layer 106 may comprise p$^+$-GaN, and may have a thickness of about 500 nm and a carrier concentration greater than about $2 \times 10^{18}$ cm$^{-3}$.

Doped layer contacts 112, voltage blocking layer contacts 114 and cap layer contact 116 are formed on respectively the first doped layer 100, second doped layer 104 and cap layer 106. The layers may be etched as appropriate to expose the appropriate layers. A bottom contact 110 may be deposited on the back surface of the substrate 10, for example, if the bulk GaN substrate 10 is n$^+$-type.

Suitable compositions for the n-type contacts (contacts on n-type layers) include Ti/Al/Ti/Au, Ti/Al/Ni/Au, and Ti/Al/Pt/Au stacks, wherein each stack layer is between about 10 and about 500 nm thick, and deposition is achieved by electron beam evaporation, thermal evaporation, or other techniques. The first Ti layer is preferably between 10 and 30 nm thick, the Al layer between 50 and 300 nm thick, and the outermost layers between 30 and 70 nm thick. Suitable compositions for the p-type contacts (contacts on p-type layers) include Ni/Au and Pt/Au stacks, wherein the first layer of the stack is between about 20 and 200 nm and the Au layer is between about 100 and 1000 nm thick. Following the depositions the structure is annealed, at a temperature between about 500° C. and 950° C., or preferably between about 750 and 870° C., in order to achieve ohmic contacts for the contact layers.

Figure 11:
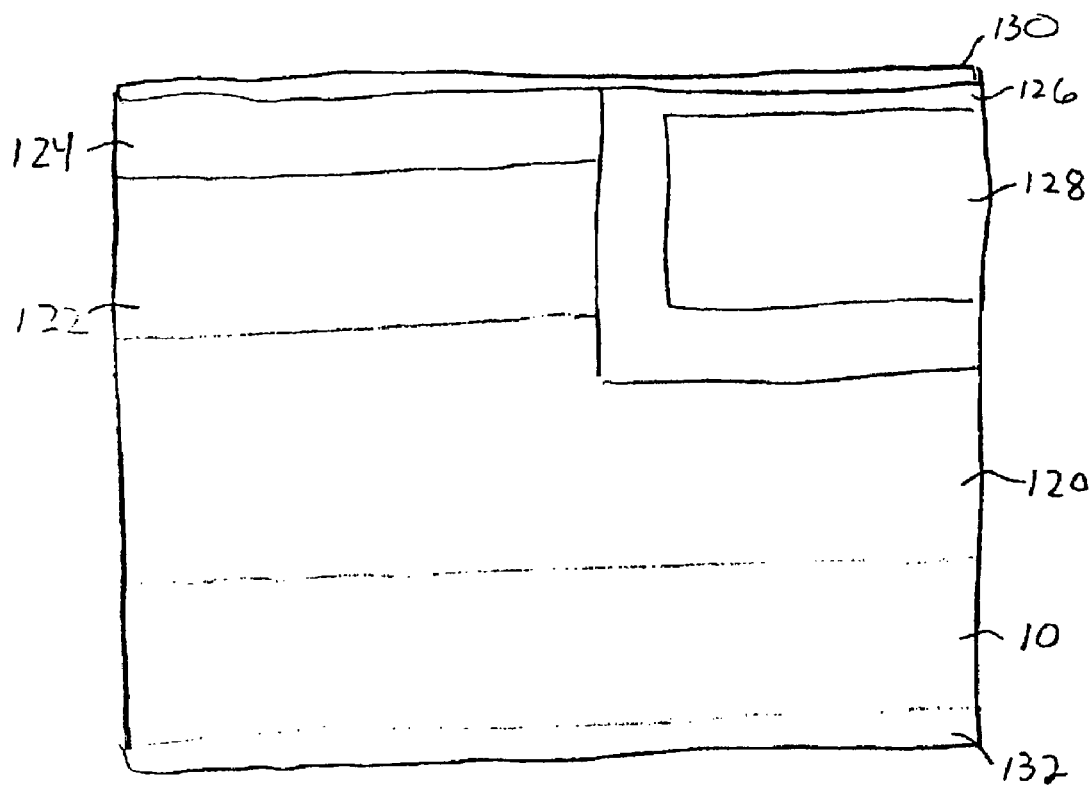
FIG. 11 is a schematic illustration of a UMOSFET/UMISFET device according to another preferred embodiment of the invention.
Figure 12:
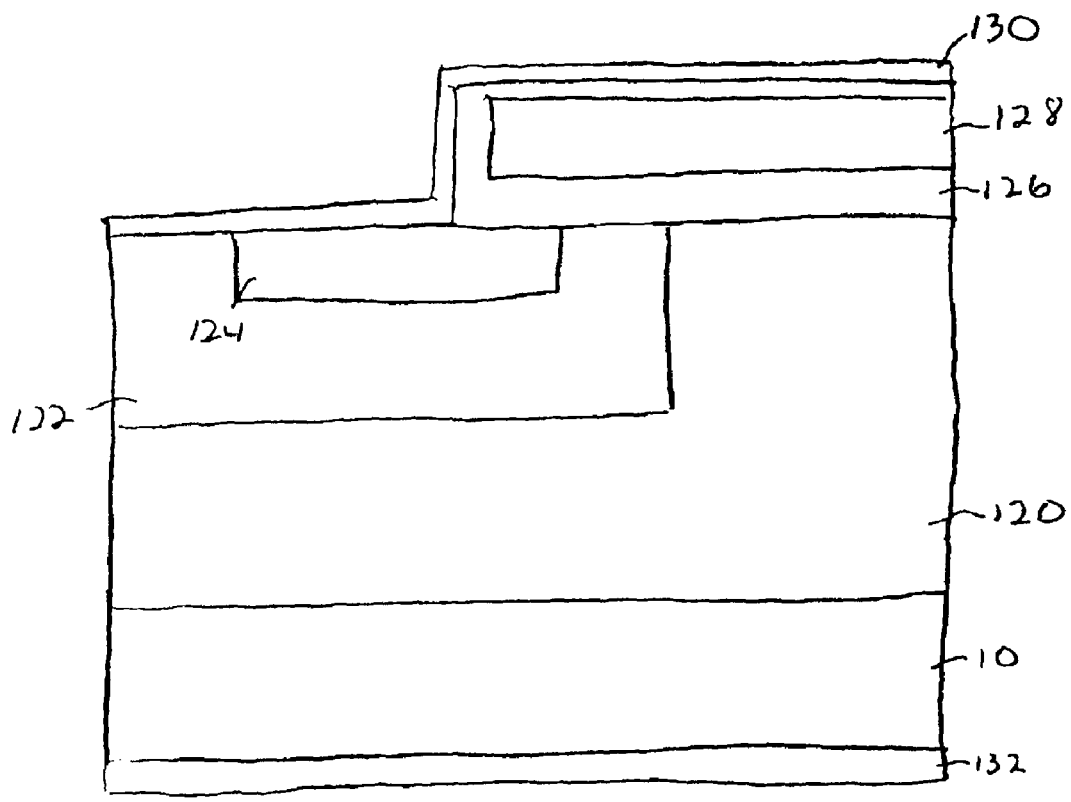
FIG. 12 is a schematic illustration of a DMOSFET/DMISFET device according to another preferred embodiment of the invention.

FIGS. 11 and 12 illustrate two other embodiments of the invention where the devices are power vertical MOSFETs or MISFETs (MOSFET for devices with a gate oxide, and MISFET for devices with a gate insulating layer). FIG. 11 illustrates a UMOSFET/UMISFET, while FIG. 12 illustrates a DMOSFET/DMISFET. The "U" in UMOSFET or UMISFET refers to the shape of the trench structure where the gate is located. The "D" in DMOSFET or DMISFET refers to the diffusion or doubly-implanted layers in the structure. The MOSFET/MISFET vertical structure is similar in operation to a lateral MOSFET/MISFET device, but the current flow is directed vertically through the substrate in the vertical structure. The descriptions of UMOSFETs and DMOSFETs below involve npn-type structures, but analogous devices with pnp structures are also possible.

Referring again to the UMOSFET of FIG. 11, the device includes a GaN substrate 10. The GaN substrate 10 may be n-type, for example. A voltage blocking layer 120 is formed over the substrate 10 and may be, for example, n-type with a carrier concentration of about $1 \times 10^{17}$ to $5 \times 10^{16}$ cm$^{-3}$. The voltage blocking layer 120 may be, for example, GaN, and may have a thickness, for example, of greater than about 400 nm.

A p-type channel layer 122 is formed over the voltage blocking layer 120. The p-type channel layer 122 may be, for example, p-doped to a carrier concentration of about $2 \times 10^{17}$ cm$^{-3}$. The p-type channel layer 122 may be, for example, GaN, and may have a thickness, for example, of between about 100 and 200 nm.

A n-type source layer 124 is formed over the p-type channel layer 122. The n-type source layer 124 may be, for example, GaN.

A trench may be etched into voltage blocking layer 120, p-type channel layer 122 and n-type source layer 124 to allow for formation of the gate insulator 126 and metal gate 128. The trench may be formed by plasma etching, for example.

After the trench is etched, part of the gate insulator 126 is formed in the trench. The gate insulator 126 material may be, for example, an oxide such as at least one of $SiO_2$, $Sc_2O_3$, MgO, $Ga_2O_3$, and $R_2O_3$, where R is a rare-earth element such as Gd. Suitable compositions for a non-oxide gate insulator 126 include AlN and $Si_3N_4$. The metal gate 128 is then deposited into the trench on the gate insulator 126, then overcoated with oxide or non-oxide insulating material to form some of the gate insulator 126 over the metal gate 128 except above one or more points (not shown) where electrical contacts are made to the metal gate 128.

A source contact 130 is then formed over the n-type source layer 124, while a bottom contact 132 is formed on the back surface of the substrate 10. Suitable compositions for contacts 130 and 132 include Ti/Al/Ti/Au, Ti/Al/Ni/Au, and Ti/Al/Pt/Au stacks, wherein each stack layer is between about 10 and about 500 nm thick, and deposition is achieved by electron beam evaporation, thermal evaporation, or other techniques. The first Ti layer is preferably between 10 and 30 nm thick, the Al layer between 50 and 300 nm thick, and the outermost layers between 30 and 70 nm thick. Following the depositions the structure is annealed, at a temperature between about 500° C. and 950° C., or preferably between about 750 and 870° C., in order to achieve ohmic contacts for the contact layers.

FIG. 12 illustrates a DMOSFET device structure. The DMOSFET is similar to the UMOSFET, however, the gate insulator 126 and the metal gate 128 are not formed in a trench, but over the p-type layer 122 and n-type layer 124. Furthermore, in the DMOSFET device structure, the p-type layer 122 and n-type layer 124 may be formed in the voltage blocking layer 120 using selective area ion implantation, diffusion doping, or, alternatively, epitaxy followed by etching, additional epitaxy, and re-planarization.

In the DMOSFET the gate insulator 126 and the metal gate 128 act to modulate the portion of the channel layer 122 under the gate. Current flows laterally from source 124 through channel 122 and then vertically through voltage blocking layer 120 to bottom contact 132. For both the UMOSFET and the DMOSFET, the voltage blocking layer supports the blocking voltage under normally off conditions. This vertical device structure greatly benefits from the absence of a band offset and voltage drop at the epi/substrate interface of the homoepitaxial device structure compared to a heteroepitaxial structure. In addition, the reduced dislocation density in the homoepitaxially grown voltage blocking layer 120, and resulting longer carrier lifetime gives rise to a conductivity modulation of the voltage blocking layer which will lower the overall power loss of the device.

Figure 13:
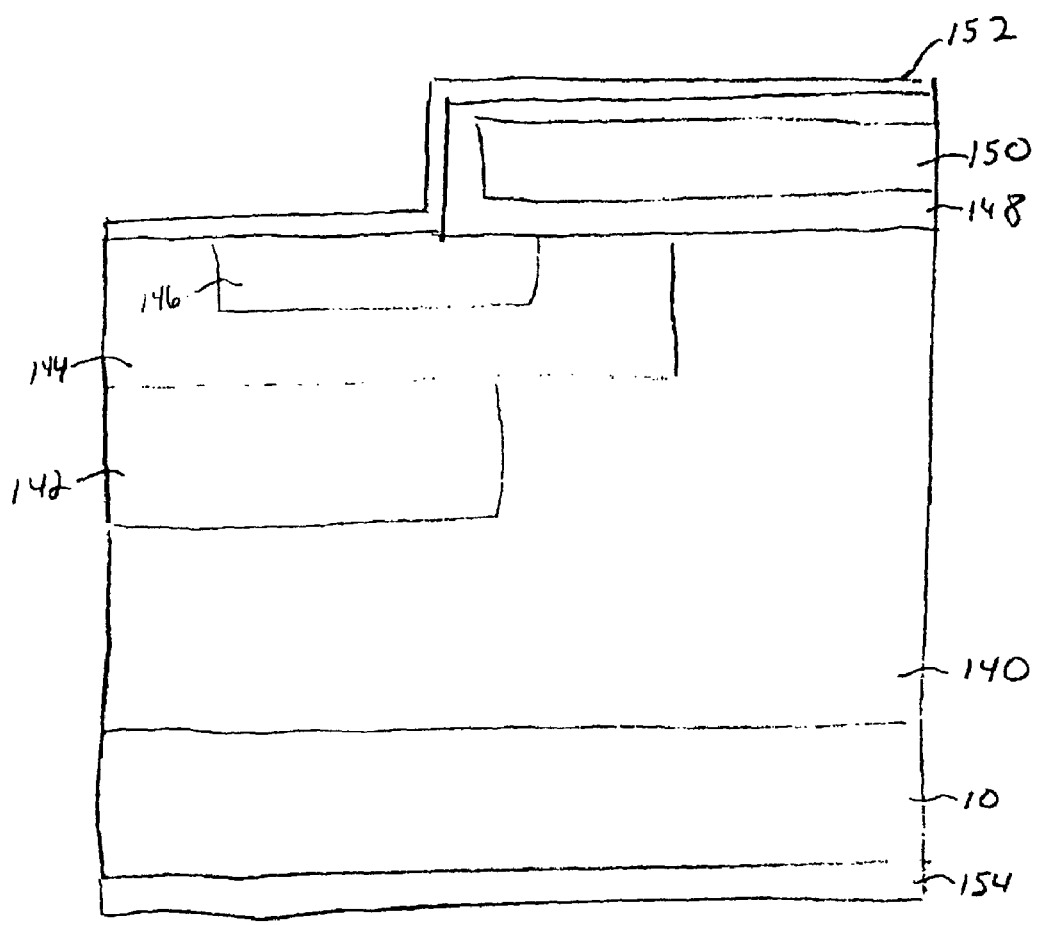
FIG. 13 is a schematic illustration of a power Insulated Gate Bipolar Transistor (power IGBT) device according to another preferred embodiment of the invention.

FIG. 13 illustrates another embodiment of the invention where the device is a power Insulated Gate Bipolar Transistor (power IGBT). The power IGBT can be fabricated in either $n^+$-p-n-$p^+$ or $p^+$-n-p-$n^+$ configuration, but for simplicity will only be described in detail as $n^+$-p-n-$p^+$. Fabrication of the $p^+$-n-p-$n^+$ is directly analogous, with the p-doped layers being substituted for n-doped layers and vice versa. The operation and fabrication of the power IGBT is similar to that of the power lateral DMOSFET of the embodiment of FIG. 12. In the power IGBT, however, the substrate is of the opposite polarity to the blocking layer, effectively making a DMOSFET in series with a p-i-n junction diode such that the device will only conduct current in one direction.

The power IGBT includes a p-type substrate 10, an n-type voltage blocking layer 140 formed on the p-type substrate 10, a heavily doped p-type base layer 142 formed in and over the blocking layer 140, a lightly doped p-type base layer 144 formed in and over the blocking layer 140, and over the heavily doped p-type base layer 142, and an n-type emitter 146 formed in the lightly doped p-type base layer 144. A gate insulating layer 148 is formed over the doped layer and partially surrounds a metal gate 150. Finally an emitter contact 152 is formed over and contacting the emitter 146, and a bottom contact 154 is formed on the reverse side of the substrate 10.

The substrate may be p-doped GaN. The voltage blocking layer 140 may be n-doped GaN, for example, with a doping concentration of about $1 \times 10^{16}$ to $5 \times 10^{16}$ cm$^{-3}$, and with a thickness of greater than about 400 nm. The heavily doped p-type base layer 142 may be, for example, GaN with a doping concentration of about $2 \times 10^{18}$ cm$^{-3}$, and with a thickness of between about 100 and 200 nm. The lightly doped p-type base layer 144 may be, for example, GaN with a doping concentration of about $2 \times 10^{17}$ cm$^{-3}$, and with a thickness of between about 100 and 200 nm. The n-type emitter 146 may be, for example, GaN with a doping concentration of about $1 \times 10^{18}$ cm$^{-3}$, and with a thickness of between about 50 and 100 nm. The gate insulator 148 material may be, for example, an oxide such as at least one of $SiO_2$, $Sc_2O_3$, MgO, $Ga_2O_3$, and $R_2O_3$, where R is a rare-earth element such as Gd.

Suitable compositions for a non-oxide gate insulator 148 include AlN and $Si_3N_4$. The metal gate 150 may be, for example, Mo. Suitable compositions for the emitter contact 152 include Ti/Al/Ti/Au, Ti/Al/Ni/Au, and Ti/Al/Pt/Au stacks, wherein each layer of the stack is between about 10 and about 500 nm thick, and deposition is achieved by electron beam evaporation, thermal evaporation, or other techniques. The first Ti layer is preferably between 10 and 30 nm thick, the Al layer between 50 and 300 nm thick, and the outermost layers between 30 and 70 nm thick. Suitable compositions for the bottom contact 154 include Ni/Au and Pt/Au stacks, wherein the first layer is between about 20 and 200 nm and the Au layer is between about 100 and 1000 nm thick. Following the depositions the structure is annealed, at a temperature between about 500° C. and 950° C., or preferably between about 750 and 870° C., in order to achieve an ohmic contact.

The n-type emitter layer 146, the lightly doped p-type base layer 144 and the heavily doped p-type base layer 142 may be created using selective area ion implantation, diffusion doping, or, alternatively, epitaxy followed by etching a trench, epitaxial filling of the trench, and re-planarization, for example. The purpose of the heavily doped p-type base layer 142 is to suppress latch-up of the parasitic thyristor inherent to the device structure. The n-type voltage blocking layer 140 will have a thickness and doping concentration that varies according to the blocking voltage desired. Like the DMOSFET and UMOSFET described above, this vertical device structure greatly benefits from the higher conductivity of the bulk GaN substrate. In addition, the reduced dislocation density in the homoepitaxially grown blocking layer, and resulting longer carrier lifetime gives rise to a conductivity modulation of the drift region which will lower the overall power loss of the device.

Figure 14:
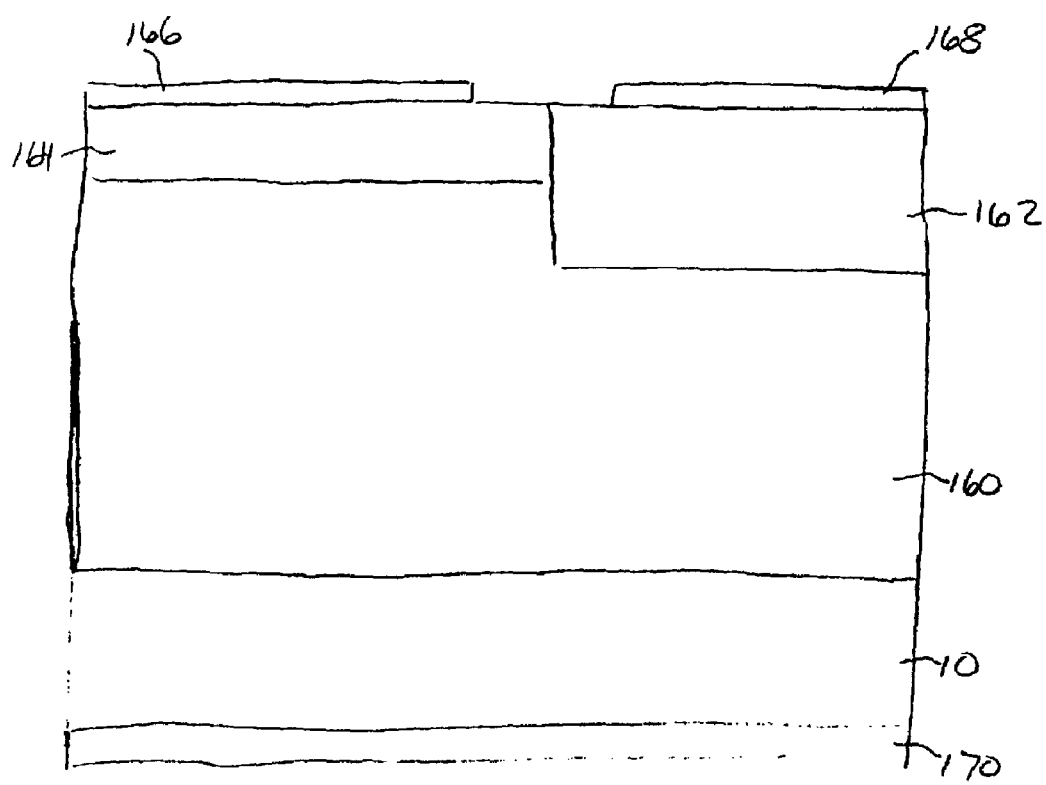
FIG. 14 is a schematic illustration of a power vertical JFET device according to another preferred embodiment of the invention.

FIG. 14 illustrates another embodiment of the invention where the device is a power vertical JFET. The power vertical JFET includes a n-type substrate 10, an lightly doped n-type voltage blocking layer 160 formed on the n-type substrate 10, a heavily doped n-type source layer 164 formed over the blocking layer 160, a p-type gate layer 162 formed in and over the blocking layer 160. A source contact layer 166 is formed on the source layer 164. A gate contact layer 168 is formed on the gate layer 162. Finally a drain contact 170 is formed on the reverse side of the substrate 10.

In the vertical JFET structure the current flow is directed vertically from the source layer 164 through the blocking layer 160 through substrate 10. This device is a normally-on device. It is turned off by applying a negative bias to the pn junction between the source and gate layers 164 and 162. With sufficient reverse bias on the pn junction, the depletion layer expands below the source layer 164 and pinches off the channel, preventing vertical current flow. This structure consists of a buried channel where issues of surface traps and insulating layers are minimized. The large critical field of GaN allows this structure to have a high blocking voltage with low on-state resistance. Also, this device is a unipolar majority carrier device and is capable of high switching speed due to the absence of stored minority charge. This device can be designed to be normally off by reducing the width of source layer 164 to below approximately 1 micron such that the built-in depletion region extending from gate layer 162 pinches off the channel under source layer 164.

The substrate may be n-type GaN. The voltage blocking layer 160 may be n-type GaN, for example, with a doping concentration of about $1 \times 10^{16}$ to $5 \times 10^{16}$ cm$^{-3}$, and with a thickness of greater than about 5000 nm. The source layer 164 may be, for example, n-type GaN with a doping concentration of about $1\times10^{18}$ cm$^{-3}$, and with a thickness of between about 100 and 500 nm. The gate layer 162 may be, for example, p-type GaN with a doping concentration of greater than about $5\times10^{17}$ cm$^{-3}$, and with a thickness of between about 750 and 2000 nm. The source contact 166 may be, for example, Ti/Al/Ti/Au. The gate contact 168 may be, for example, Ni/Au. The drain contact 170 may be, for example, Ti/Al/Ti/Au. The thickness and doping values are for a blocking voltage on the order of 1000V. In general, the doping and thickness values would depend on the desired blocking voltage characteristic.

The blocking layer 160 and source layer 164 may be grown epitaxially in a preferred embodiment, while the gate layer 162 may be formed by implanting with a p-type implant species (such as Mg) into the blocking layer 160 and source layer 164. Alternatively, the gate layer 162 may be formed by epitaxially re-growth after trench etching of the region where the gate layer 162 is to be grown and then planarized to smooth the top surface.

Figure 15:
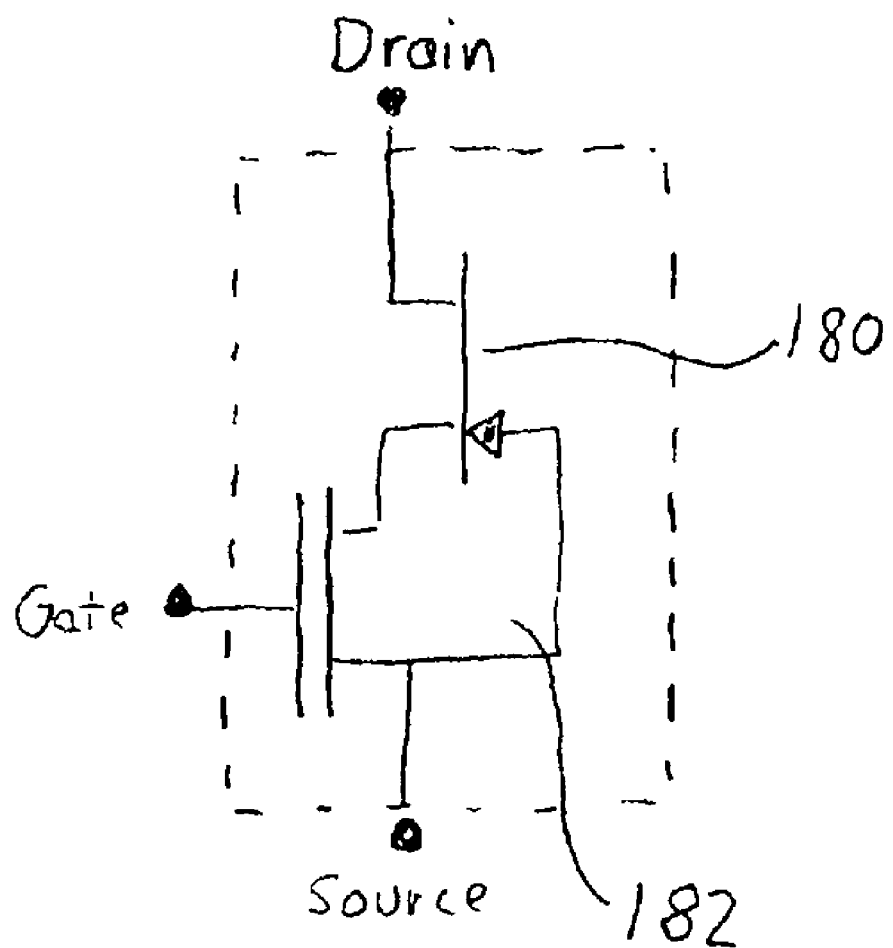
FIG. 15 schematically illustrates a possible way of implementing a cascode configuration according to another preferred embodiment of the invention.

The above described normally-on power vertical JFET can be combined with a low voltage FET in a cascode configuration making a normally-off circuit that is voltage controlled. FIG. 15 illustrates a GaN vertical JFET 180 in cascode with a low-voltage discrete silicon MOSFET 182. Alternatively, 182 may instead constitute a discrete SiC or a GaN based low-voltage normally-off FET.

Figure 16:
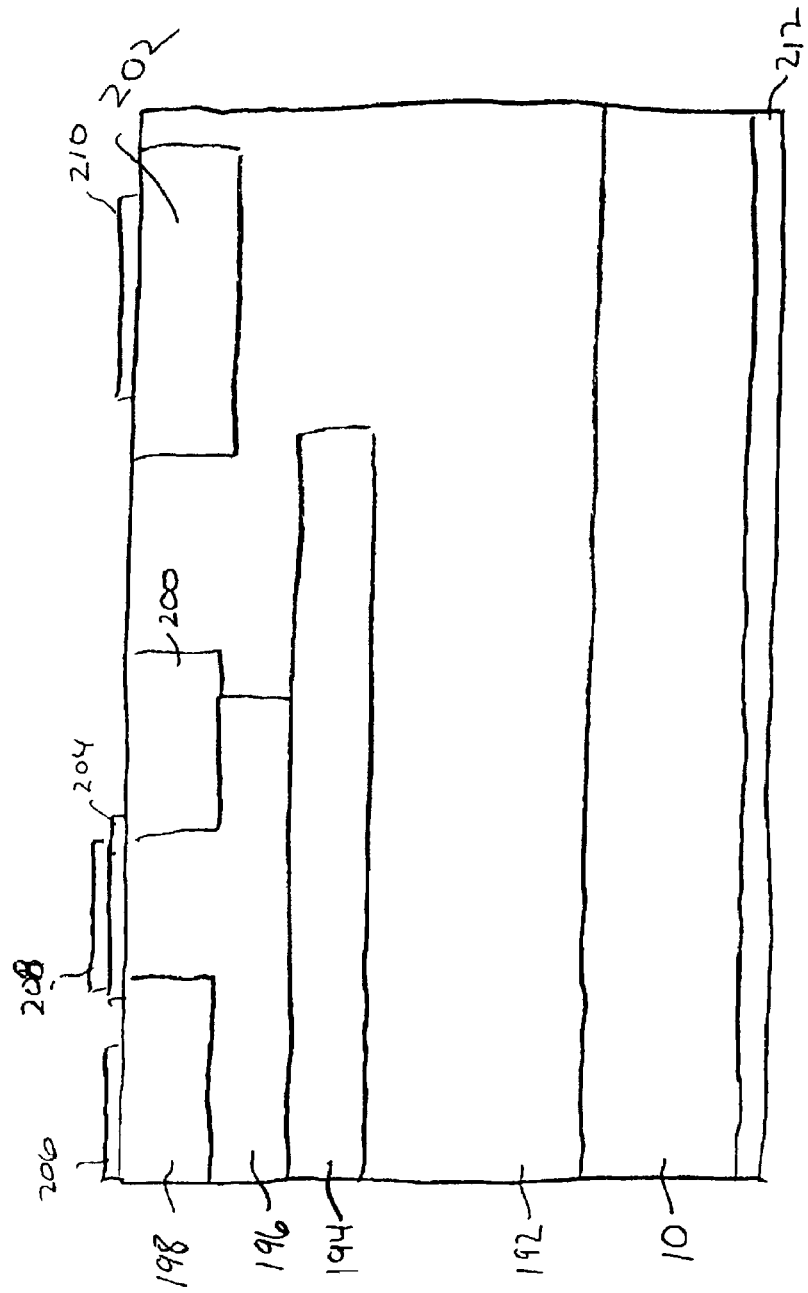
FIG. 16 is a schematic illustration of an integrated approach to a cascode configuration where a low voltage GaN normally-off FET is integrated on the same substrate as a vertical JFET according to another preferred embodiment of the invention.

FIG. 16 illustrates another embodiment of the invention demonstrating an integrated approach to the cascode configuration where a low voltage GaN normally-off FET is integrated as a part of the structure on the same substrate with a vertical JFET. The integrated structure includes a substrate 10, a n-type blocking layer 192 formed over the substrate 10, a buried p-type gate layer 194 formed in the blocking layer 192, a p-type well layer 196 formed on the buried gate layer 194, n-type source 198 and n-type drain 200 formed in the well layer 196, and a p-type field stop 202 formed in the blocking 192 and lateral to the n-type source 198 and n-type drain 200. The device also includes a source contact 206 on the source 198, a gate contact 208 on an insulating layer 204 which is on the channel region in well layer 196 between the source 198 and drain 200, a field stop contact 210 on the field stop 202 and a drain contact 212 on the reverse side of the substrate 10.

The substrate may be n-type GaN. The blocking layer 192 may be n-type GaN, for example, with a doping concentration of about $1\times10^{16}$ to $5\times10^{16}$ cm$^{-3}$, and with a thickness of greater than about 5000 nm. The buried gate layer 194 may be p-type GaN, for example, with a doping concentration of about $1\times10^{19}$, and with a thickness of between about 100 and 500 nm. The well layer 196 may be p-type GaN, for example, with a doping concentration of about $1\times10^{17}$, and with a thickness of between about 500 and 2000 nm. The field stop layer 202 may be p-type GaN, for example, with a doping concentration of about $1\times10^{19}$, and with a thickness of between about 100 and 500 nm. The source and drain 198 and 200 may be n-type GaN, for example, with a doping concentration of about $1\times10^{19}$, and with a thickness of between about 100 and 500 nm. The insulating layer 204 may be an oxide, or other insulating layer, for example, Suitable compositions for the source contact 206 and drain contact 212 include Ti/Al/Ti/Au. Suitable compositions for gate contact 208 and field stop contact 210 include Ni/Au.

The devices described in the above embodiments may be discrete, for example for HBT, Schottky rectifier, p-i-n rectifier, thyristor, or vertical MOSFET or JFET devices, or they may consist of arrays, for example for the HEMT, MESFET, and MOSFET/MISFET devices.

Figure 17:
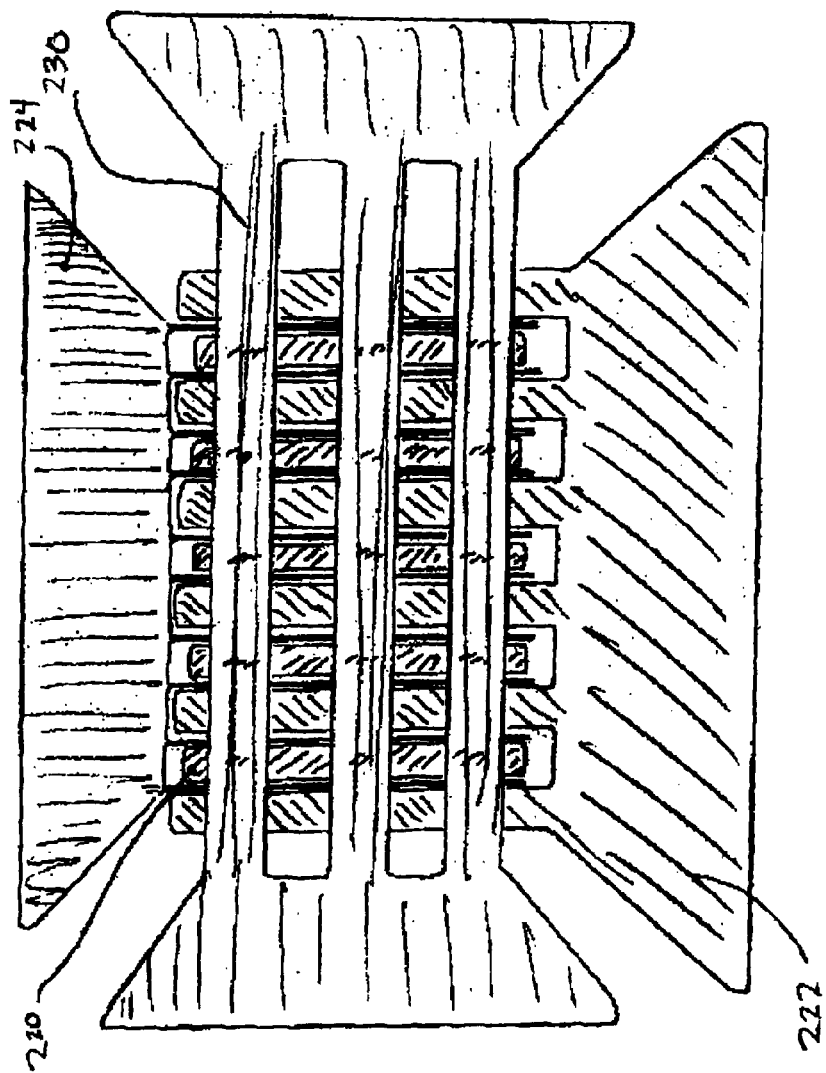
FIG. 17 is a schematic illustrating an examples of a HEMT array according to another preferred embodiment of the invention.

An example of a HEMT array is shown in FIG. 17. The array device includes gate contacts 224, drain contacts 222, and source contacts 220. External electrical connection to the array of source contacts is made by means of air bridges 230, which are bonded to source contacts 220, but pass over drain contacts 222 and gate contacts 224 without making any electrical contact. The array device includes an active region (not shown) below the contacts, where the array device includes a number of HEMT components in an array.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A homoepitaxial gallium nitride based electronic device comprising:
at least one epitaxial semiconductor layer disposed on a single crystal substrate comprised of gallium nitride, the substrate having a dislocation density less than about $10^5$ per cm$^2$ and being free of grain boundaries and of tilt boundaries, wherein the at least one semiconductor layer is included in the electronic device which comprises a transistor having source and drain contacts disposed over the substrate and a gate contact disposed between the source and drain contacts.

2. The electronic device of claim 1, wherein the dislocation density is less than about $10^3$ per cm$^2$.

3. The electronic device of claim 1, wherein the substrate has an oxygen impurity concentration of less than $3\times10^{18}$ cm$^{-3}$.

4. The electronic device of claim 3, wherein the substrate has an oxygen impurity concentration of less than $3\times10^{17}$ cm$^{-3}$.

5. The electronic device of claim 1, wherein the electronic device is a high-electron mobility transistor (HEMT), and the oxygen impurity concentration of the substrate is less than $3\times10^{18}$ cm$^3$.

6. The electronic device of claim 5, wherein the at least one semiconductor layer comprises a buffer layer disposed over the substrate.

7. The electronic device of claim 6, wherein the buffer layer comprises undoped GaN.

8. The electronic device of claim 6, wherein the at least one semiconductor layer further comprises a barrier layer formed over the buffer layer.

9. The electronic device of claim 8, wherein the barrier layer comprises undoped AlInGaN.

10. The electronic device of claim 8, wherein the barrier layer includes a top sub barrier layer and a bottom sub layer, wherein the bottom sub layer has a higher bandgap than the top sub barrier layer.

11. The electronic device of claim 10, wherein the bottom sub barrier layer comprises AlN and the top sub barrier layer comprises AlGaN.

12. The electronic device of claim 5, wherein the at least one semiconductor layer comprises a contact layer disposed over the substrate.

13. The electronic device of claim 12, wherein the contact layer comprises n-doped GaN.

14. A homoepitaxial gallium nitride based electronic device consisting essentially of:

at least one epitaxial semiconductor layer disposed on a single crystal substrate comprised of gallium nitride, the substrate having a dislocation density less than about $10^5$ per $cm^2$, wherein the at least one semiconductor layer is included in the electronic device which comprises one of a transistor having source and drain contacts disposed over the substrate and a gate contact disposed between the source and drain contacts.

15. The electronic device of claim 14, wherein the dislocation density is less than about $10^3$ per $cm^2$.

16. The electronic device of claim 14, wherein the substrate has an oxygen impurity concentration of less than $3 \times 10^{18}$ $cm^{-3}$.

17. The electronic device of claim 16, wherein the substrate has an oxygen impurity concentration of less than $3 \times 10^{17}$ $cm^{-3}$.

18. The electronic device of claim 14, wherein the electronic device is a high-electron mobility transistor (HEMT), and the oxygen impurity concentration of the substrate is less than $3 \times 10^{18}$ $cm^3$.

* * * * *